(12) United States Patent
Xie et al.

(10) Patent No.: US 9,412,616 B1
(45) Date of Patent: Aug. 9, 2016

(54) METHODS OF FORMING SINGLE AND DOUBLE DIFFUSION BREAKS ON INTEGRATED CIRCUIT PRODUCTS COMPRISED OF FINFET DEVICES AND THE RESULTING PRODUCTS

(71) Applicant: GLOBALFOUNDRIES Inc., Grand Cayman (KY)

(72) Inventors: Ruilong Xie, Niskayuna, NY (US);
Kwan-Yong Lim, Niskayuna, NY (US);
Min Gyu Sung, Latham, NY (US);
Ryan Ryoung-Han Kim, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/942,448

(22) Filed: Nov. 16, 2015

(51) Int. Cl.
*H01L 21/00* (2006.01)
*H01L 21/3105* (2006.01)
*H01L 21/027* (2006.01)
*H01L 21/306* (2006.01)
*H01L 21/308* (2006.01)
*H01L 21/311* (2006.01)
*H01L 21/3205* (2006.01)
*H01L 21/3213* (2006.01)
*H01L 21/283* (2006.01)
*H01L 21/762* (2006.01)

(52) U.S. Cl.
CPC ...... *H01L 21/31051* (2013.01); *H01L 21/0273* (2013.01); *H01L 21/283* (2013.01); *H01L 21/3081* (2013.01); *H01L 21/30604* (2013.01); *H01L 21/31111* (2013.01); *H01L 21/32055* (2013.01); *H01L 21/32133* (2013.01); *H01L 21/76224* (2013.01)

(58) Field of Classification Search
CPC ............... H01L 21/31051; H01L 21/32055; H01L 21/76224
See application file for complete search history.

(56) References Cited

U.S. PATENT DOCUMENTS

| | | | | |
|---|---|---|---|---|
| 8,674,413 B1* | 3/2014 | Chi | ........ | H01L 27/0924 257/213 |
| 8,703,577 B1* | 4/2014 | Zhu | ........ | H01L 21/3081 257/501 |
| 8,878,309 B1* | 11/2014 | Hong | ........ | H01L 27/0886 257/330 |
| 9,070,742 B2* | 6/2015 | Xie | ........ | H01L 21/76224 |
| 9,171,752 B1* | 10/2015 | Wu | ........ | H01L 21/76224 |
| 9,324,617 B1* | 4/2016 | Akarvardar | ..... | H01L 21/823412 |
| 9,324,619 B2* | 4/2016 | Baek | ........ | H01L 21/823431 |
| 2011/0068431 A1* | 3/2011 | Knorr | ........ | H01L 21/76229 257/506 |
| 2014/0203376 A1* | 7/2014 | Xie | ........ | H01L 21/76224 257/401 |
| 2015/0017781 A1* | 1/2015 | Lin | ........ | H01L 21/76224 438/424 |

(Continued)

*Primary Examiner* — Laura Menz
(74) *Attorney, Agent, or Firm* — Amerson Law Firm, PLLC

(57) ABSTRACT

One illustrative method disclosed herein includes, among other things, forming a multi-layer patterned masking layer comprised of first and second layers of material and first and second openings that extend through both of the first and second layers of material, wherein the first opening is positioned above a first area of the substrate where the DDB isolation structure will be formed and the second opening is positioned above a second area of the substrate where the SDB isolation structure will be formed. The method also includes performing a first process operation through the first opening to form the DDB isolation structure, performing a second process operation to remove the second layer of material and to expose the first opening in the first layer of material, and performing a third process operation through the second opening to form the SDB isolation structure.

22 Claims, 24 Drawing Sheets

(56) References Cited

U.S. PATENT DOCUMENTS

| | | | | |
|---|---|---|---|---|
| 2015/0054089 A1* | 2/2015 | Hong | ................. | H01L 27/0886 257/401 |
| 2015/0303249 A1* | 10/2015 | Bentley | ............... | H01L 29/0649 257/622 |
| 2016/0056081 A1* | 2/2016 | Baek | ............... | H01L 21/823431 438/283 |
| 2016/0071848 A1* | 3/2016 | Sengupta | ............ | H01L 27/0886 257/401 |
| 2016/0117431 A1* | 4/2016 | Kim | .................... | G06F 17/5072 716/119 |

* cited by examiner

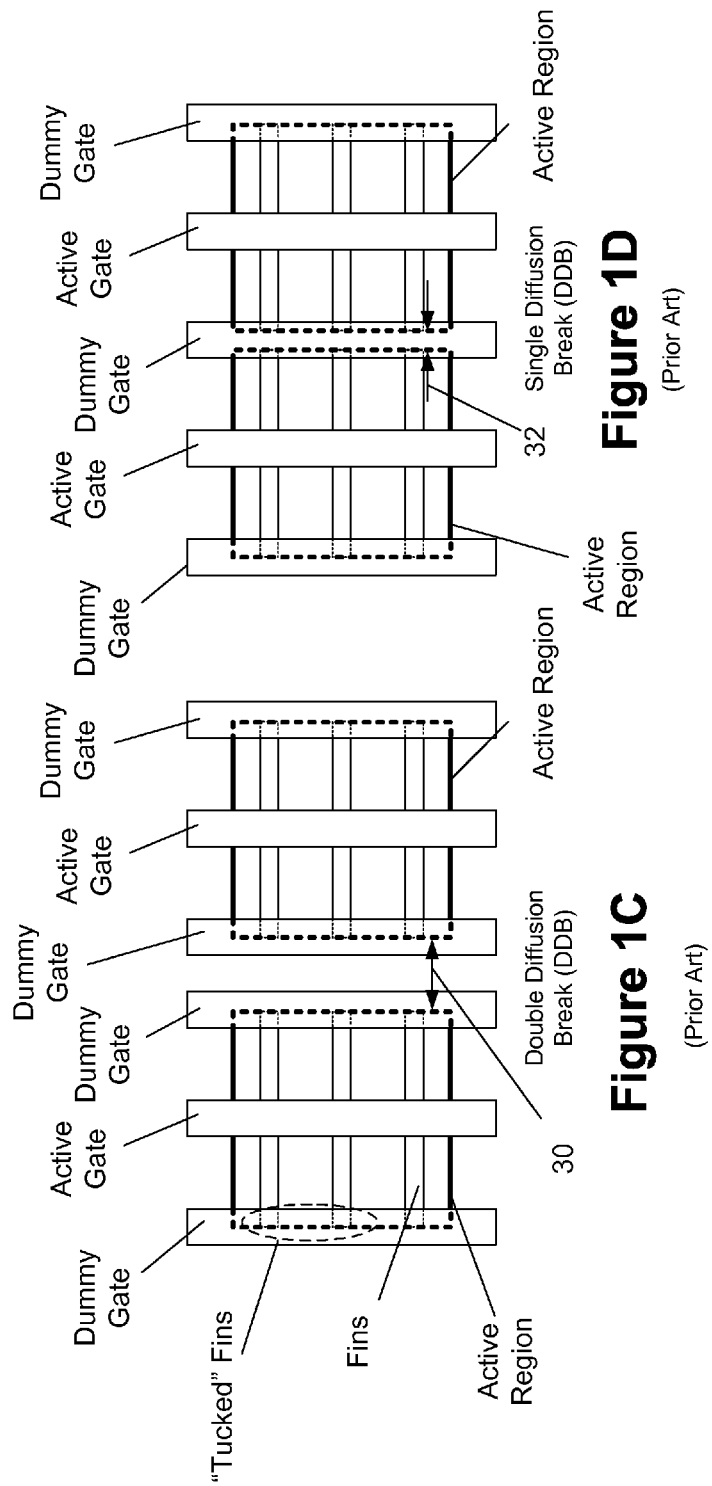

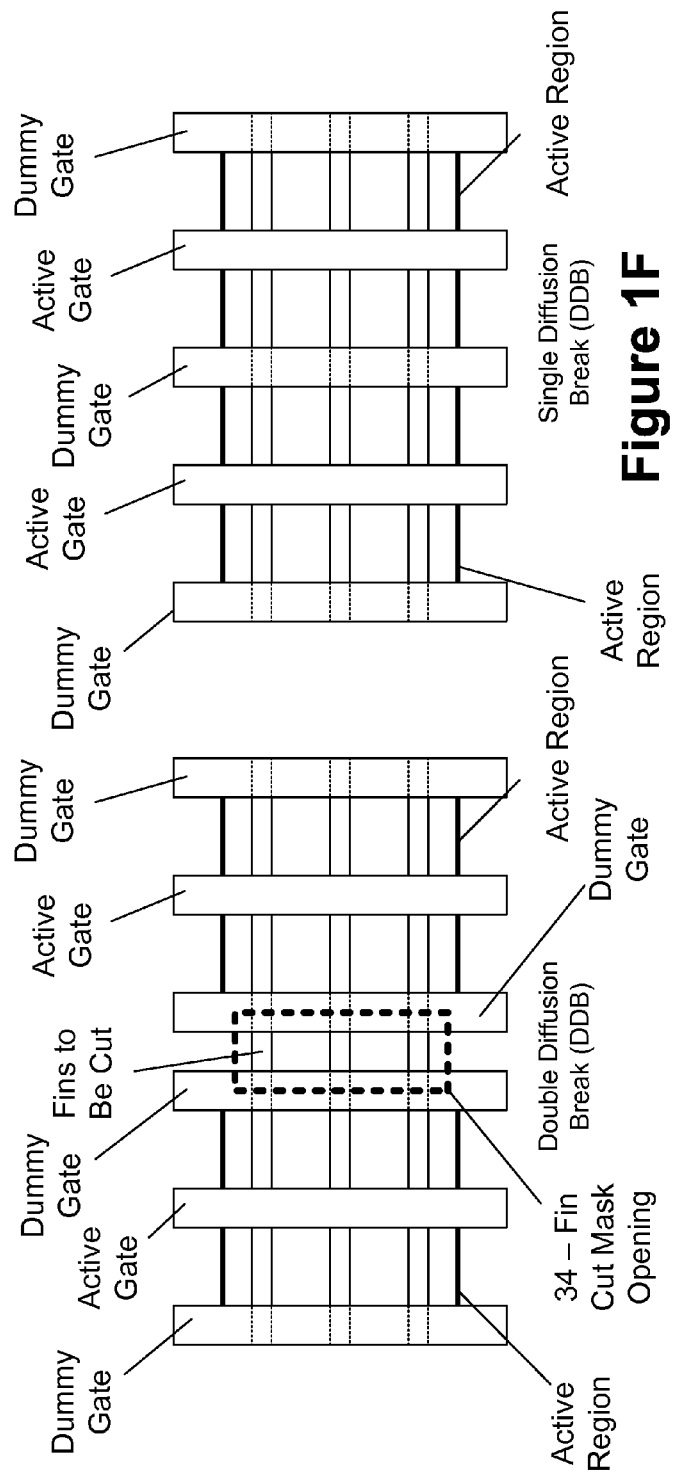

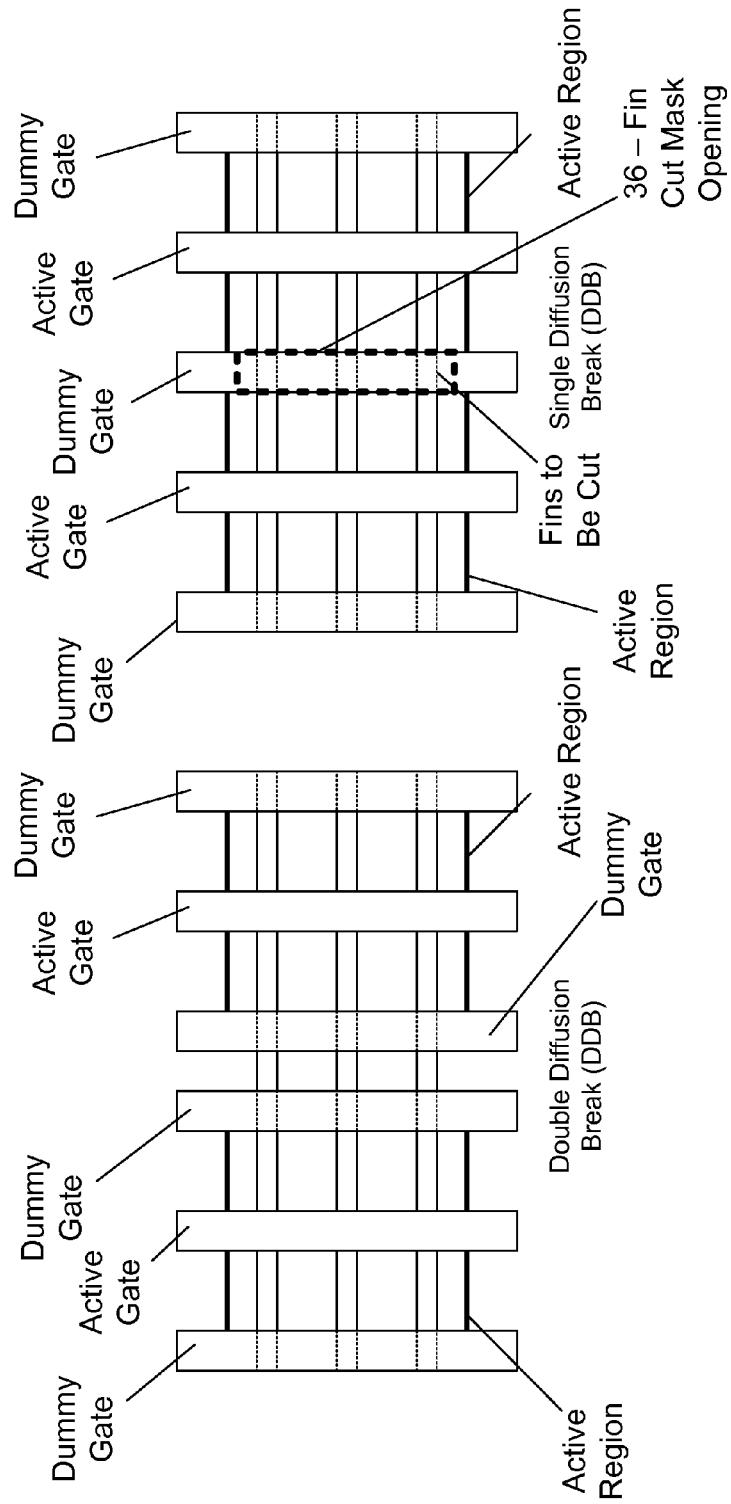

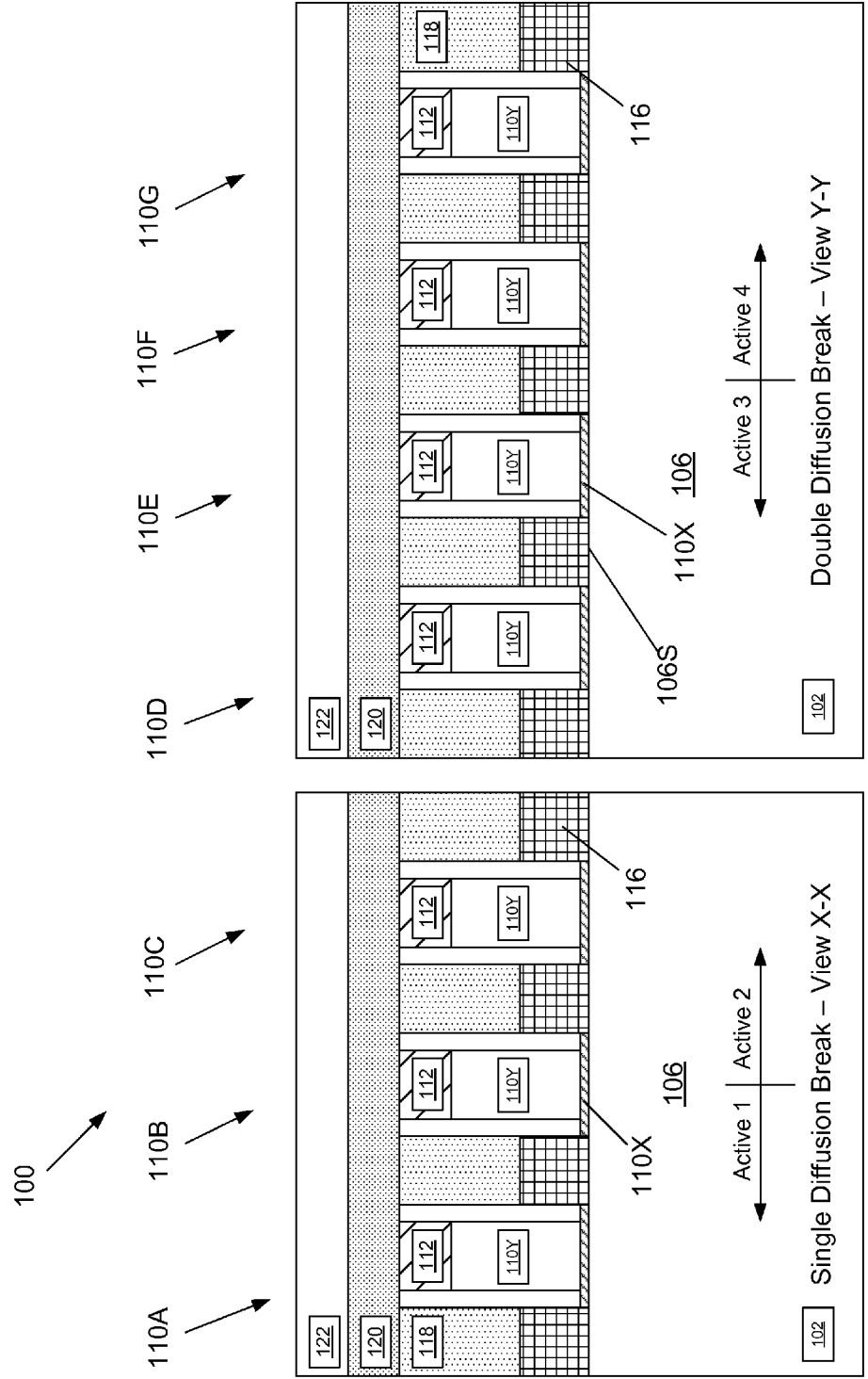

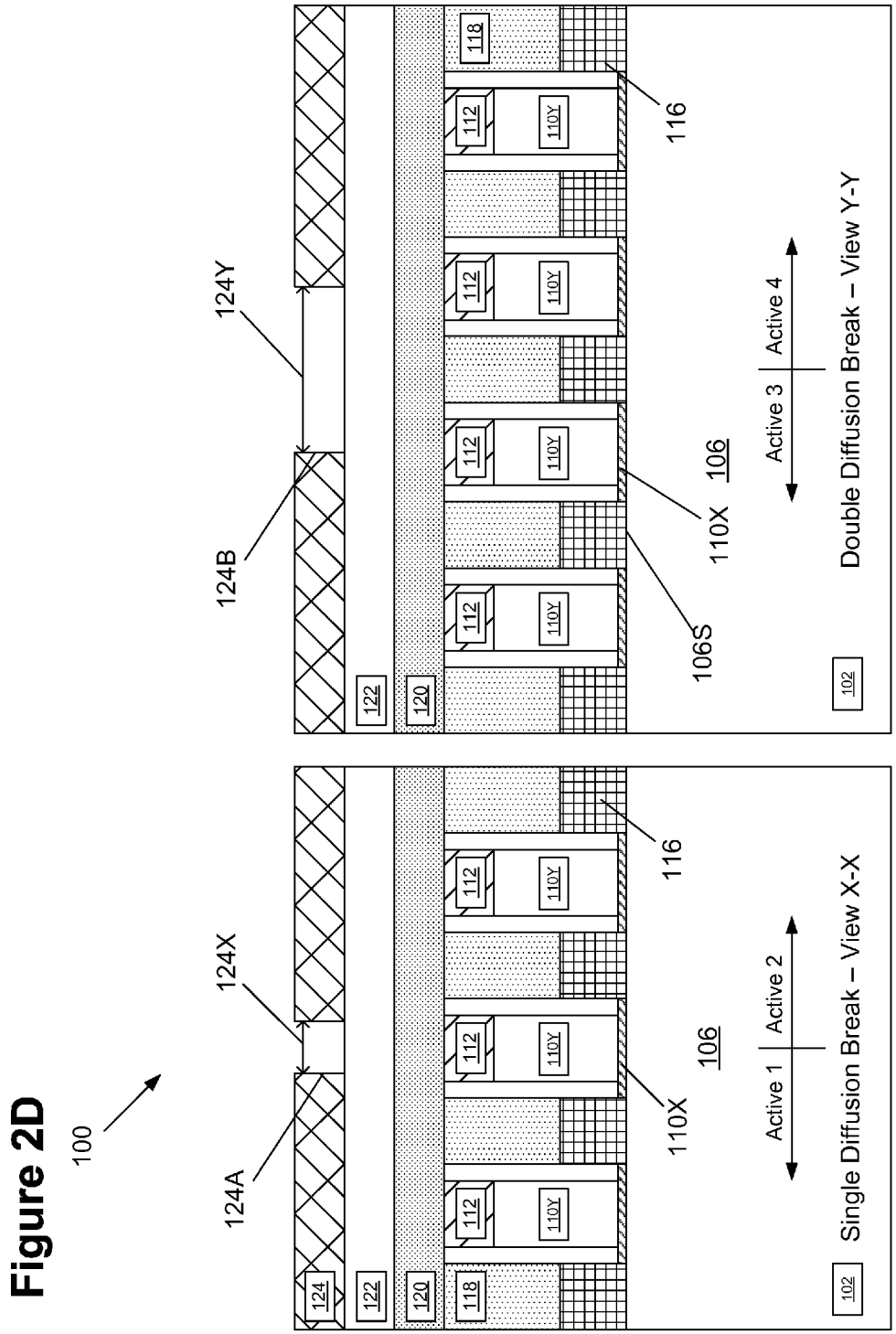

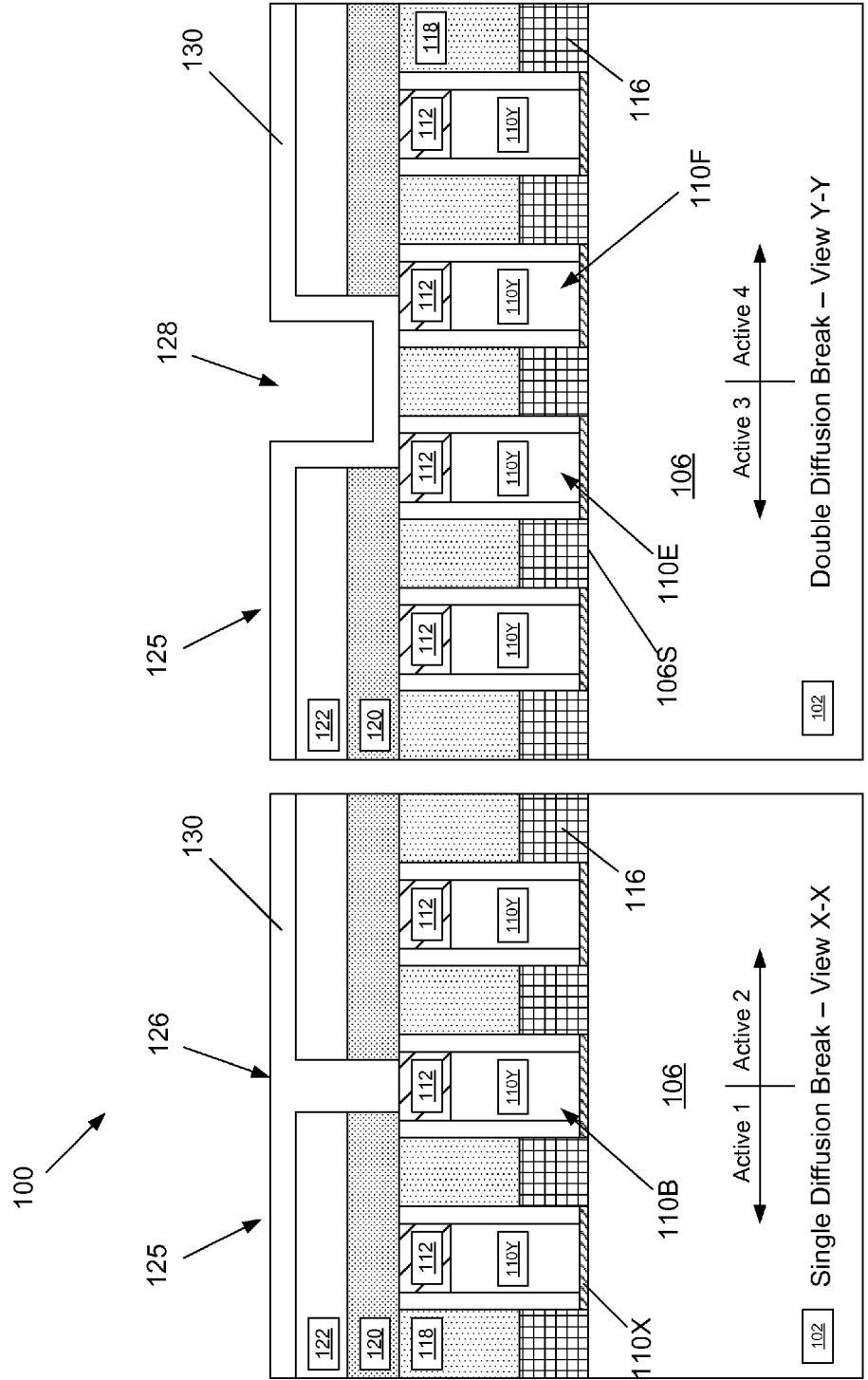

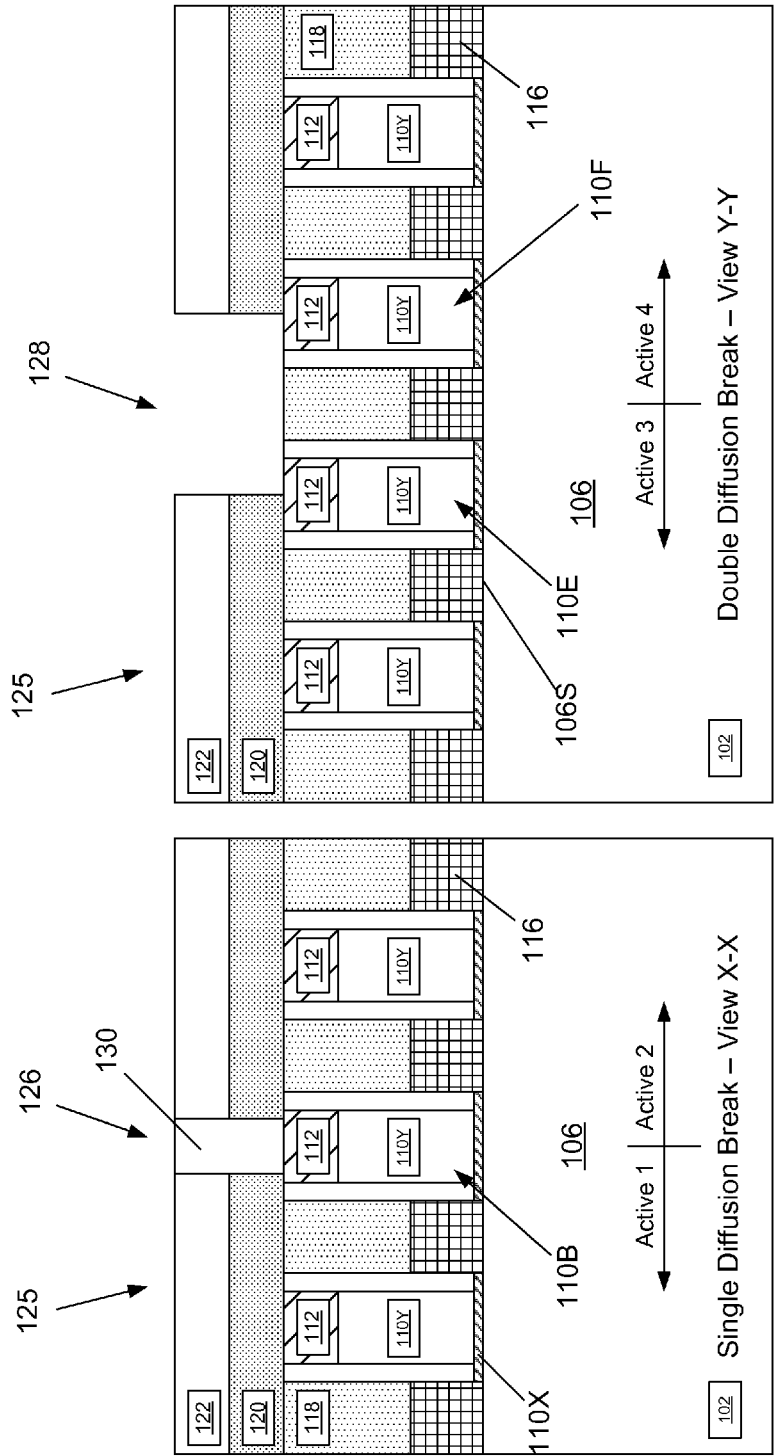

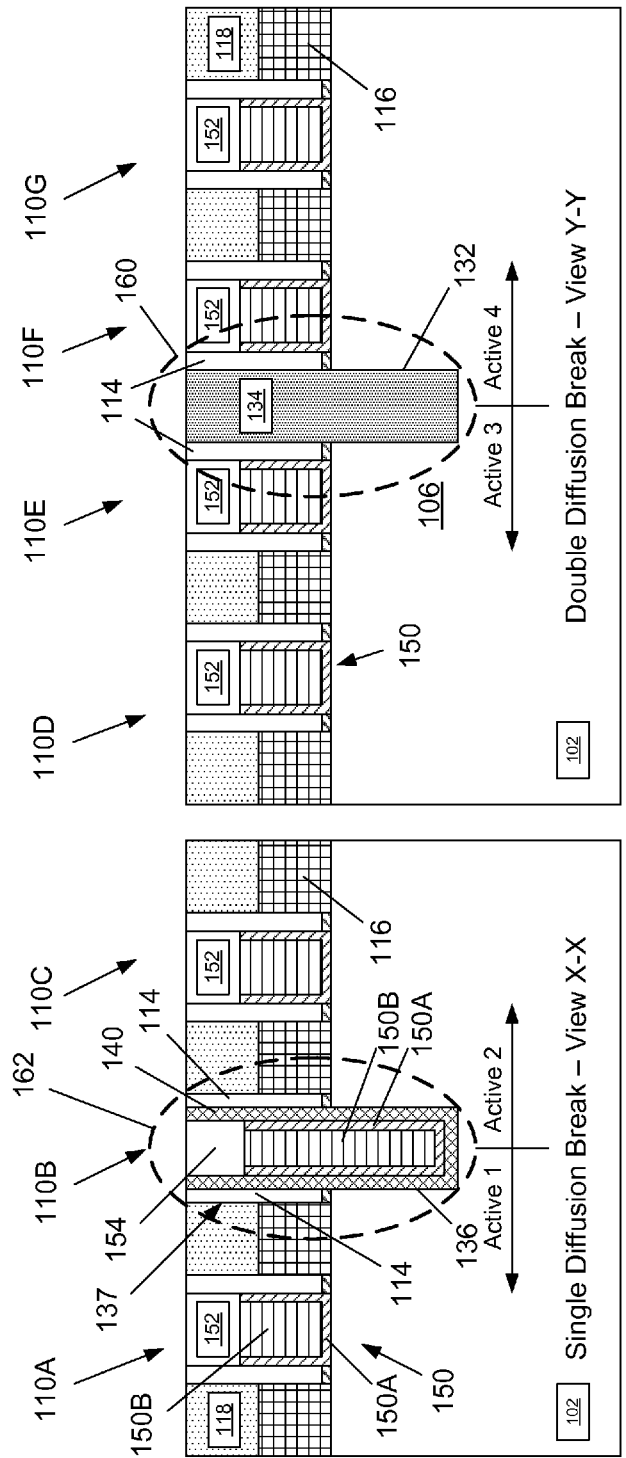

US 9,412,616 B1

METHODS OF FORMING SINGLE AND DOUBLE DIFFUSION BREAKS ON INTEGRATED CIRCUIT PRODUCTS COMPRISED OF FINFET DEVICES AND THE RESULTING PRODUCTS

BACKGROUND OF THE INVENTION

1. Field of the Invention

Generally, the present disclosure relates to the manufacture of semiconductor devices, and, more specifically, to various novel methods of forming single and double diffusion breaks on integrated circuit (IC) products comprised of FinFET devices and the resulting IC products.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of trenches 13, three illustrative fins 14, a gate structure 16, a sidewall spacer 18 and a gate cap layer 20. An isolation material 17 provides electrical isolation between the fins 14. In more advanced devices, the gate structure 16 is typically comprised of a layer of insulating material (not separately shown), e.g., a layer of high-k insulating material, and one or more conductive material layers that serve as the gate electrode for the device 10. The fins 14 have a three dimensional configuration: a height H, a width W and an axial length L. The axial length L corresponds to the direction of current travel in the device 10 when it is operational. The portions of the fins 14 covered by the gate structure 16 are the channel regions of the FinFET device 10. The portions of the fins 14 that are positioned outside of the spacers 18 will become part of the source/drain regions of the device 10.

When an appropriate voltage is applied to the gate electrode 16 of a FinFET device 10, the surfaces (and the inner portion near the surface) of the fins 14, i.e., the vertically oriented sidewalls and the top upper surface of the fin, form a surface inversion layer or a volume inversion layer that contributes to current conduction. Accordingly, for a given plot space (or foot-print), FinFETs tend to be able to generate significantly higher drive current than traditional planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. One technique involves forming FinFET devices with stressed channel regions to enhance device performance (a compressively stressed channel region for a PMOS device and a tensile stressed channel region for an NMOS device). Additionally, device designers are currently investigating using alternative semiconductor materials for the channel regions of such FinFET devices, such as SiGe, Ge and III-V materials, to enhance the performance capabilities of such devices, e.g., to enable low-voltage operation without degrading their operating speed.

FIG. 1B is a perspective view of an illustrative prior art FinFET semiconductor device 10, wherein the overall fin structure of the device includes a substrate fin portion 14A and an alternative fin material portion 14B. As with the case above, the substrate fin portion 14A may be made of silicon, i.e., the same material as the substrate 12, and the alternative fin material portion 14B may be made of a material other than the substrate material, for example, silicon-germanium, substantially pure germanium, III-V materials, etc. As noted above, the use of such alternative fin materials improves the mobility of charge carriers in the device.

One well-known processing method that has been used for forming a transistor with a high-k/metal gate structure is the so-called "gate last" or "replacement gate" technique. In the replacement gate technique, a so-called "dummy" or sacrificial gate structure is initially formed and remains in place as many process operations are performed to form the device, e.g., the formation of doped source/drain regions, formation of epi semiconductor material in the source/drain regions of the device, performing an anneal process to repair damage to the substrate caused by the ion implantation processes and to activate the implanted dopant materials, etc. At some point in the process flow, the sacrificial gate structure is removed to define a gate cavity where the final HK/MG replacement gate structure for the device is formed.

The various transistor devices that are formed for an IC product must be electrically isolated from one another to properly function in an electrical circuit. Typically, this is accomplished by forming a trench in the substrate 12, and filling the trench with an insulating material, such as silicon dioxide. Within the industry, these isolation regions may sometimes be referred to as "diffusion breaks." However, the formation of such isolation structures consumes very valuable plot space on the substrate 12. Moreover, in some applications, such as those integrated circuit products employing FinFET transistor devices, as device sizes have decreased, and packing densities have increased, it is sometimes difficult to form the desired isolation region made of an insulating material.

In one illustrative prior art process flow, the fins for an integrated circuit are initially formed uniformly across the entire substrate (i.e., a "sea of fins"). Thereafter, portions of the fins are removed to define regions where isolation regions will be formed to electrically isolate the various devices. Cutting the desired portions of the fins is typically accomplished by forming a so-called "fin cut" patterned etch mask with openings corresponding to the portions of the fins to be removed. The space previously occupied by the removed portions of the fins is then filled with an insulating material. After the fins are cut, and the isolation regions are formed, the gate structures are then formed across the fins. In the case where a replacement gate process is used to manufacture the FinFET devices, the initial gate structures are sacrificial gate structures that will subsequently be removed and replaced with final gate structures for the devices. As mentioned above, several process operations are performed after the formation of the sacrificial gate structures, e.g., the formation of epi semiconductor material in the source/drain regions of the device. When the epi semiconductor material is formed in the source/drain regions, it is important that the epi material not form in unwanted areas of the devices so as to not create a multitude of problems, e.g., growing around the end of a gate structure so as to create a short circuit between the source region and drain region, bridging the space between two adjacent active regions, etc. Thus, with reference to FIG. 1C, when the fins are cut, the cut is located such that the cut ends of the fins will be positioned under the dummy gate structures when they are formed. This is sometimes referred to as the fins being "tucked" in the sense that the cut end of the fin is positioned under or "tucked under" the dummy gate structure. Such a tucked fin arrangement is required on integrated circuits having arrangements similar to that depicted in FIG. 1C so as to prevent the undesirable formation of epi semiconductor material in the space between the two dummy gates and to produce uniform source/drain regions (when the epi material is formed) for all of the devices so as to avoid variances in device performance.

Unfortunately, performing the fin cut process prior to formation of the gate structures can be detrimental as it relates to retaining desired stress conditions (e.g., compressive or tensile) when the fins are cut as there is no "anchoring structure" such as gate structures to source/drain epi material to help maintain or at least reduce the loss of some of the desired stress profiles created in the fins. This is particularly true when using alternative semiconductor materials for the channel region of the FinFET devices.

FIGS. 1C and 1D depict a FinFET based integrated circuit product comprised of two FinFET devices that are each formed above a separate active region with isolation material (not shown) positioned between the two active regions. In this example, each of the devices comprises a single active gate. Dummy gates are formed to cover the edges of the active regions so that the fins may be tucked for the reasons described above. FIG. 1C is a configuration that is referred to as a double diffusion break (DDB) wherein the lateral width 30 (in the current transport direction or gate length direction of the FinFET devices) of the isolation material between the two active regions approximately corresponds to the lateral width of two of the gate structures. FIG. 1D is a configuration that is referred to as a single diffusion break (SDB) wherein the lateral width 32 (in the current transport direction or gate length direction of the FinFET devices) of the isolation material between the two active regions is less than the lateral width of a single gate structure. In general, it is easier to form a double diffusion break (DDB) isolation structure than it is to form a single diffusion break (SDB) due to the relatively larger size of the double diffusion break (DDB) isolation structure. However, the use of such double diffusion break (DDB) isolation structures consumes more of the available plot space on a substrate than does the use of single diffusion break (SDB) isolation structures, thereby leading to reduced packing densities. Some integrated circuit products use both double diffusion break (DDB) and single diffusion break (SDB) isolation structures in different regions of a product. For example, logic regions of an integrated circuit product may employ single diffusion break (SDB) isolation structures, whereas SRAM regions may employ double diffusion break (DDB) isolation structures.

As noted above, one problem that can arise is loss of or reduction in desired stress profiles (compressive or tensile) that are intentionally created in fins when the fins are cut prior to forming any supporting structure, e.g., gates and/or source/drain epi material. One possible option would be to perform the fin cut process after the formation of gate structures (such as sacrificial gate structures) around the fins. FIGS. 1E and 1F depict an example wherein an opening 34 in a fin cut mask is shown (FIG. 1E) that exposes the fins to be removed. While cutting the fins after formation of the gate structures can be readily performed when forming double diffusion break (DDB) isolation structures, such a process will not work when forming single diffusion break (SDB) isolation structures because the portions of the fins to be removed are covered by a gate structure.

Another possibility would be to perform the fin cut process after sacrificial gate structures are removed when forming FinFET devices using replacement gate manufacturing techniques. That is, the fins to be removed would be cut by performing an etching process through the replacement gate cavity that is created after the sacrificial gate structure is removed. FIGS. 1G and 1H depict an example wherein an opening 36 in a fin cut mask is shown (FIG. 1H) that would be aligned with such a replacement gate cavity. As an initial matter, it would be very challenging to properly align the opening 36 with the replacement gate cavity. Nevertheless, such an approach may be possible when forming single diffusion break (SDB) structures. However, such an approach is more problematic when forming double diffusion break (DDB) isolation structures. More specifically, at the point in a typical replacement gate process when the sacrificial gate structure is removed, the fins are covered by an insulating material, e.g., silicon dioxide. Thus, while removal of the portions of the fins exposed within the two laterally adjacent replacement gate cavities might be possible, such a process would leave portions of the fins positioned between the two active regions, i.e., the portions of the fins between the two laterally adjacent replacement gate cavities. The presence of such residual fin material may lead to an undesirable increase in capacitance. In cases where both double diffusion break (DDB) isolation structures and single diffusion break (SDB) isolation structures are formed, it would be possible to form both of such structures after formation of the gate structures, but it would involve formation of two separate cut masks—one mask for the DDB structures and another mask for the SDB structures—which would add to processing costs and complexity.

The present disclosure is directed to methods of forming single and double diffusion breaks on IC products comprised of FinFET devices and the resulting products that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming single (SDB) and double (DDB) diffusion breaks on IC products comprised of FinFET devices and the resulting products. One illustrative method disclosed herein includes, among other things, forming a plurality of sacrificial gate structures above a plurality of fins defined in a semiconductor substrate and forming a multi-layer patterned masking layer comprised of first and second layers of material and first and second openings that extend through both of the first and second layers of material, wherein the first opening is positioned above a first area of the substrate where the DDB isolation structure will be formed and the second opening is positioned above a second area of the substrate where the SDB isolation structure will be formed. In this example, the method also includes performing at least one first process operation through the first opening to form the DDB isolation structure, performing at least one second process operation to remove the second layer of material to expose the first opening in the first layer of material, and performing at least one third process operation through the second opening to form the SDB isolation structure.

One illustrative integrated circuit product disclosed herein includes, among other things, a plurality of FinFET devices, each of which comprises a gate structure comprising a high-k gate insulation material and at least one layer of metal, a single diffusion break (SDB) isolation structure positioned in a first trench defined in a semiconductor substrate between first and second active regions, the SDB isolation structure comprising the high-k insulating material and the at least one layer of metal, and a double diffusion break (DDB) isolation structure positioned in a second trench defined in a semiconductor substrate between third and fourth active regions, the DDB isolation structure comprising a first insulating material that substantially fills the second trench.

Another illustrative integrated circuit product disclosed herein includes, among other things, a plurality of FinFET devices, a single diffusion break (SDB) isolation structure positioned in a first trench defined in a semiconductor substrate between first and second active regions, a first sidewall spacer that contacts and engages both opposite sides of the SDB isolation structure, a double diffusion break (DDB) isolation structure positioned in a second trench defined in the semiconductor substrate between third and fourth active regions and second and third sidewall spacers, wherein the second sidewall spacer engages and contacts a first side of the DDB isolation structure and the third sidewall spacer engages and contacts a second side of the DDB isolation structure.

BRIEF DESCRIPTION OF THE DRAWINGS

The disclosure may be understood by reference to the following description taken in conjunction with the accompanying drawings, in which like reference numerals identify like elements, and in which:

FIGS. 1A-1H depict illustrative prior art FinFET devices and examples of prior art double diffusion break (DDB) isolation structures and single diffusion break (SDB) isolation structures.

Figure 1A:
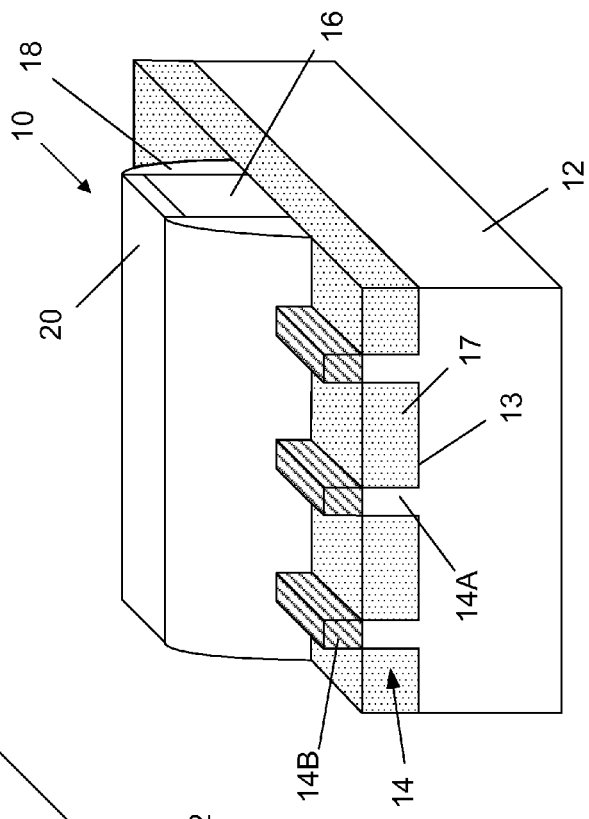
Figure 1B:
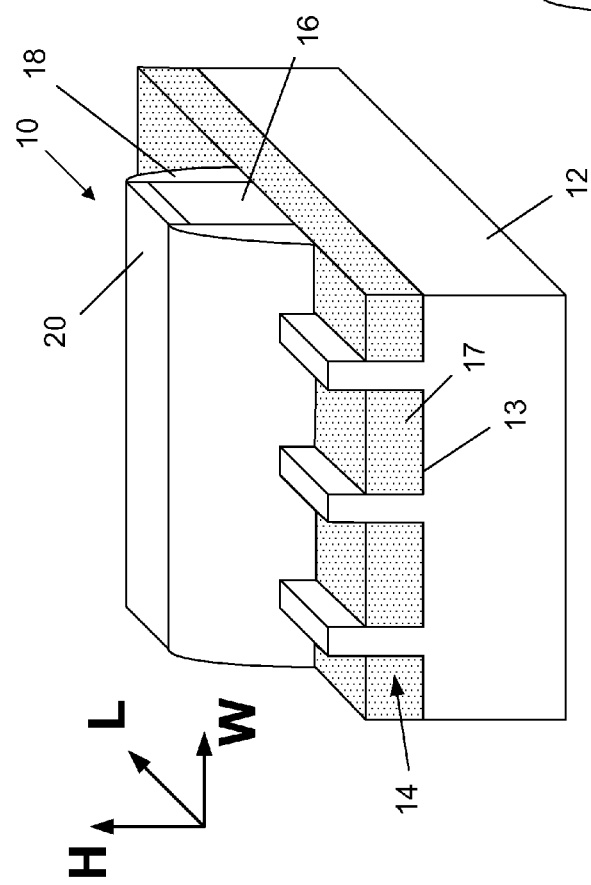

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
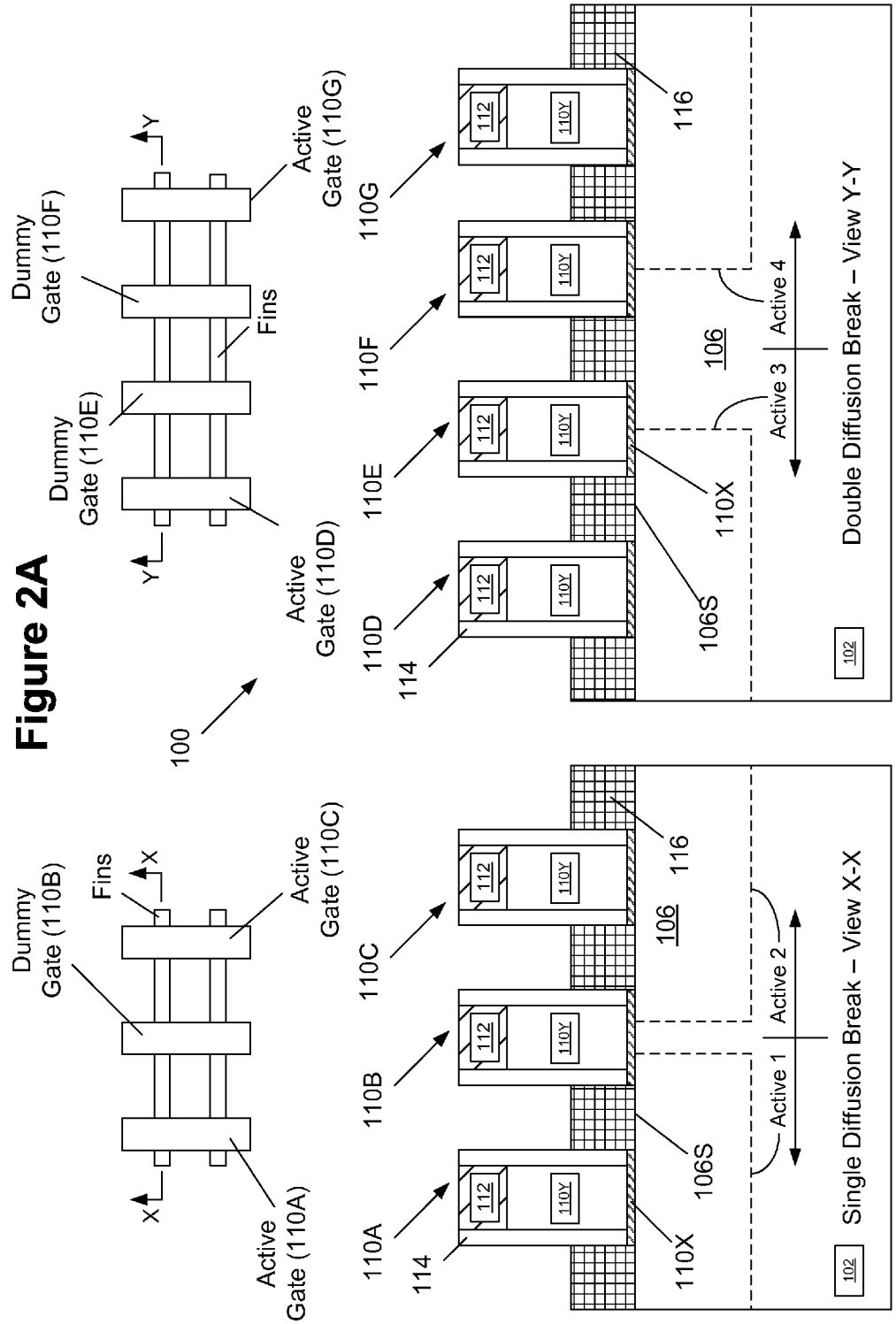
FIGS. 2A-2T depict various illustrative novel methods disclosed herein for forming single and double diffusion breaks on IC products comprised of FinFET devices and the resulting products.
Figure 2B:
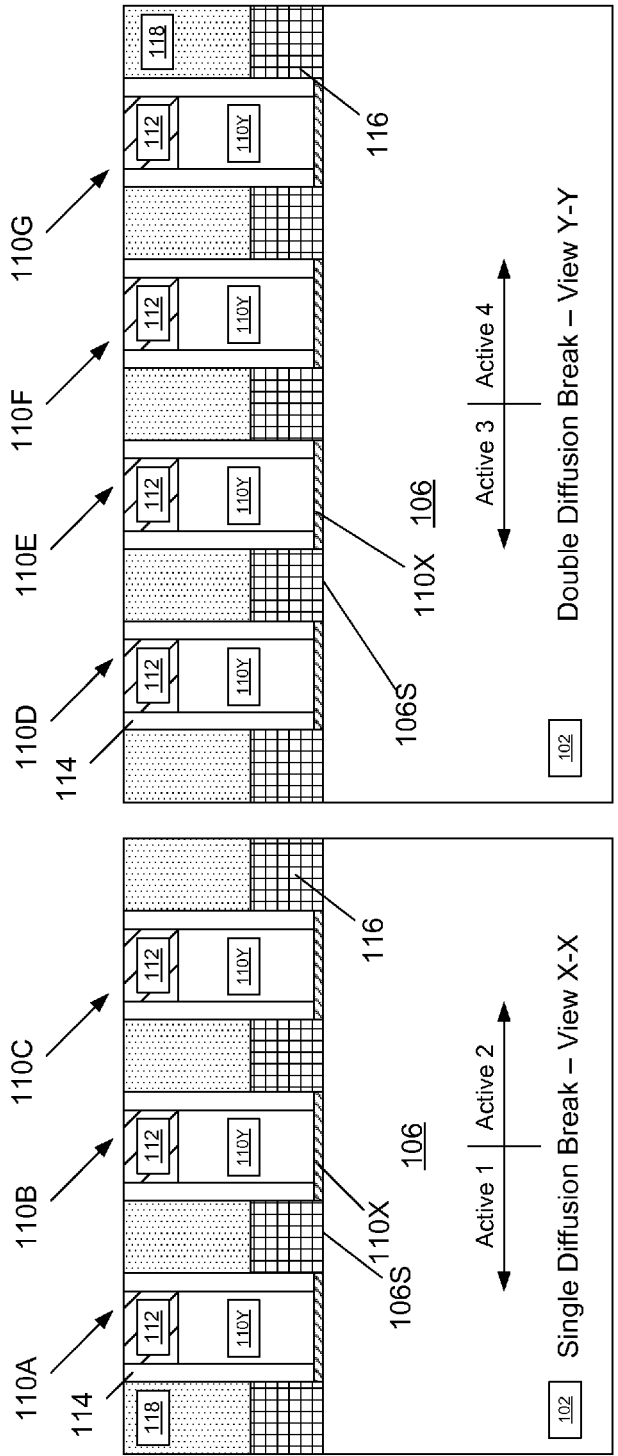
Figure 2E:
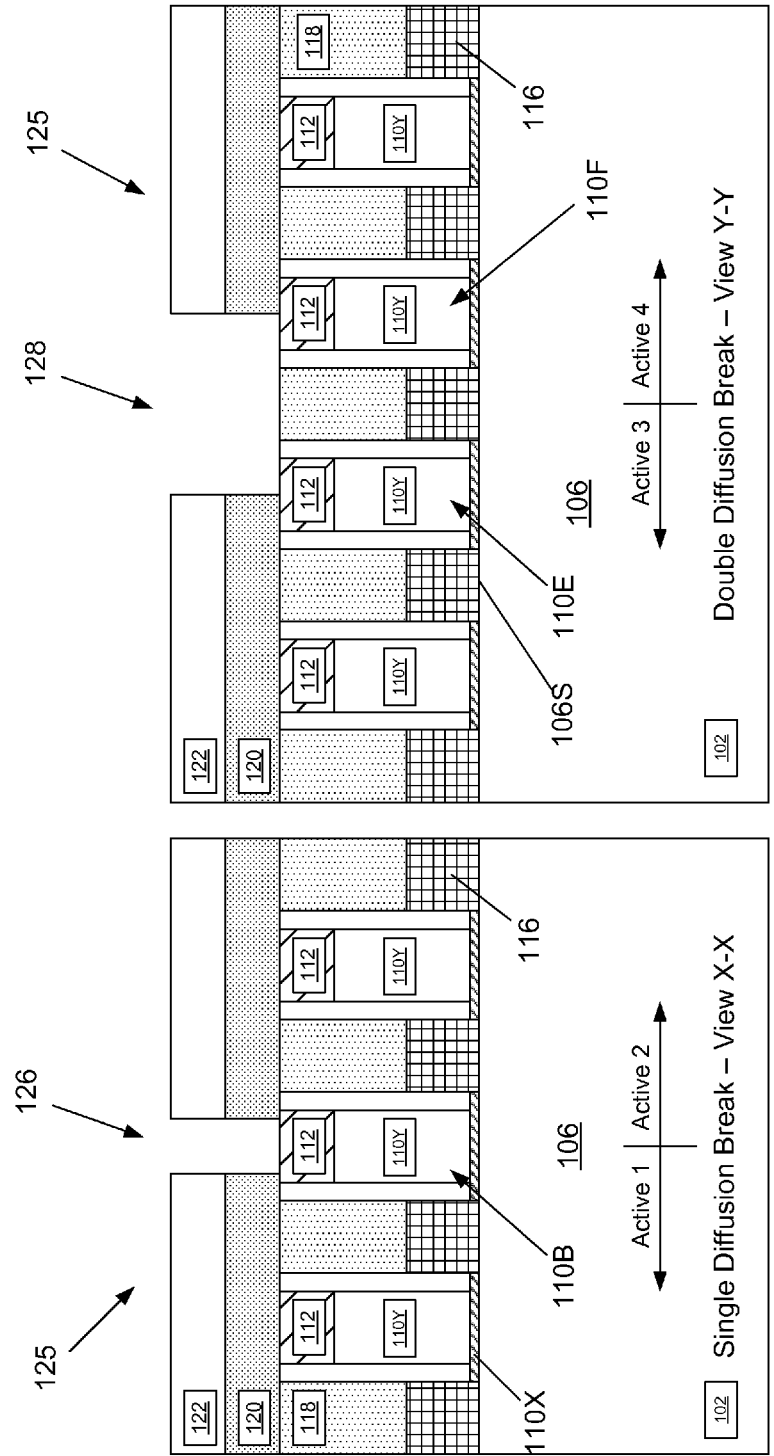
Figure 2H:
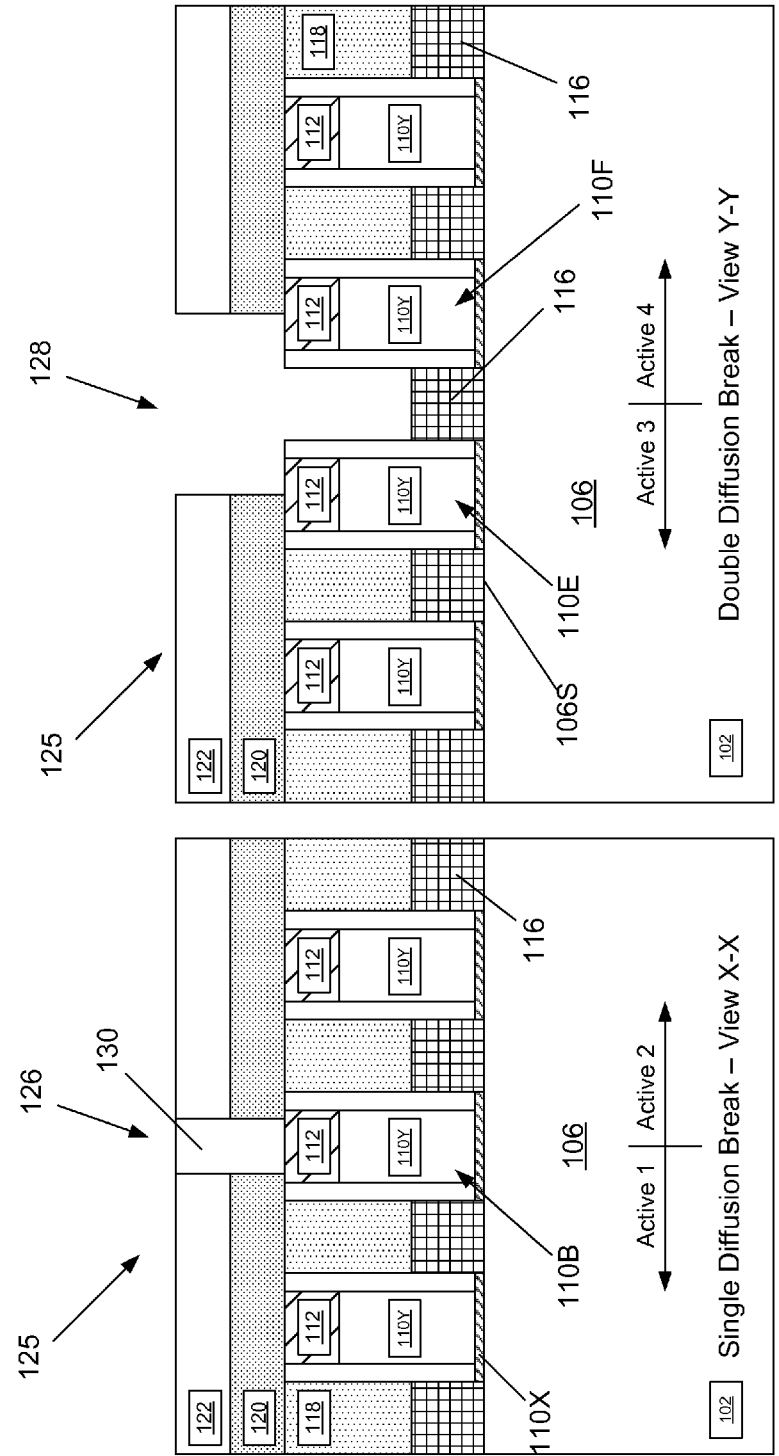
Figure 2I:
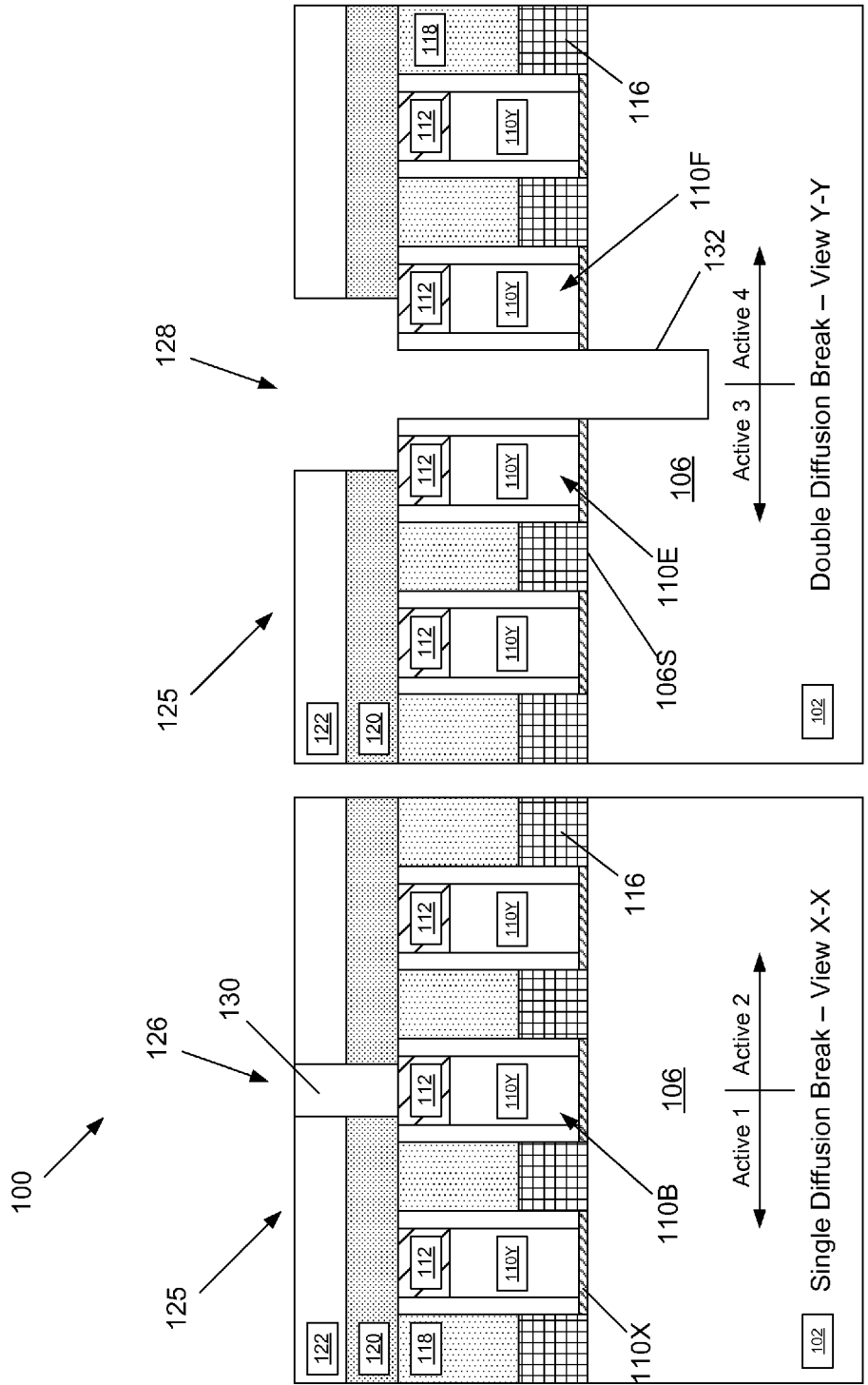
Figure 2J:
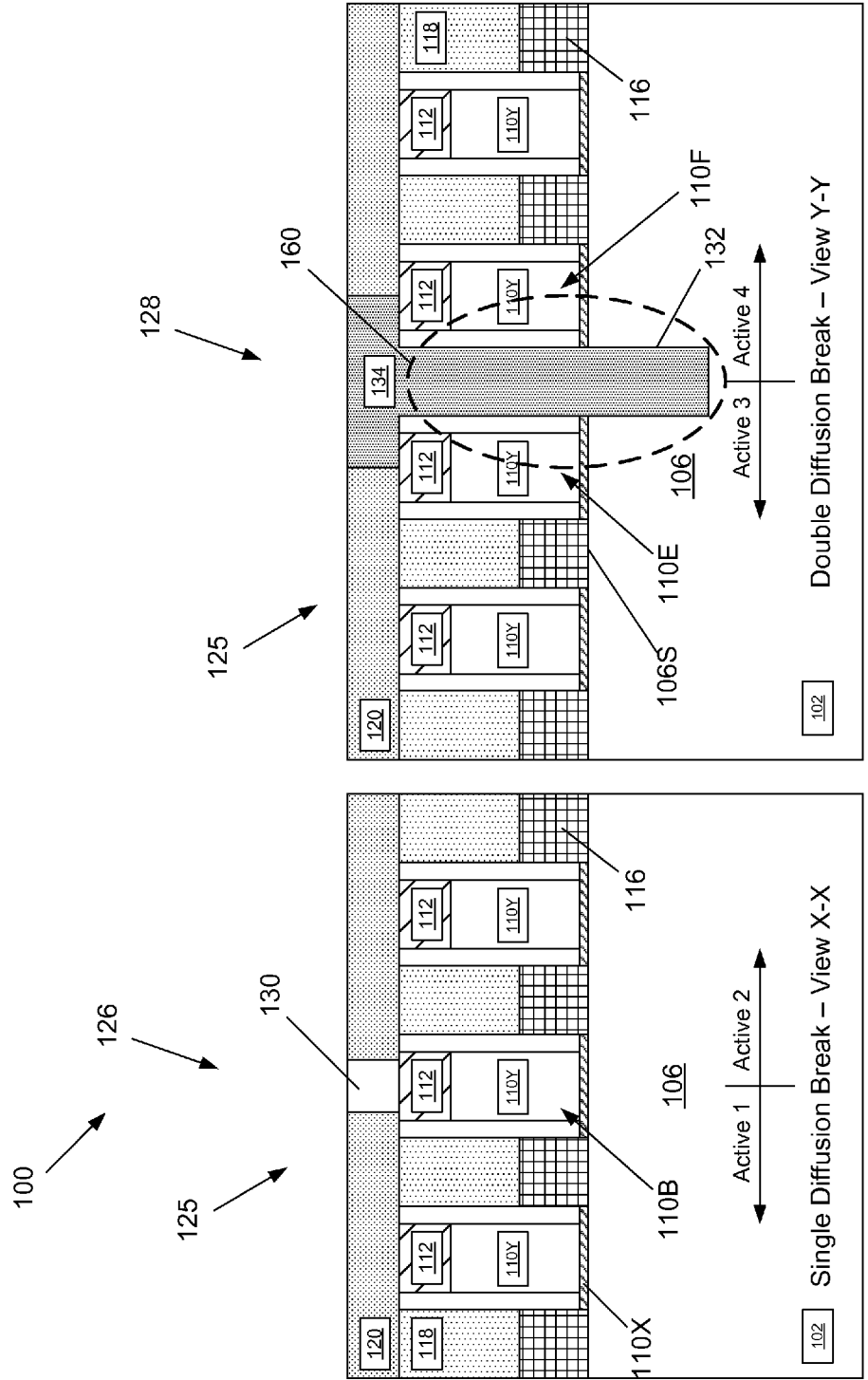
Figure 2K:
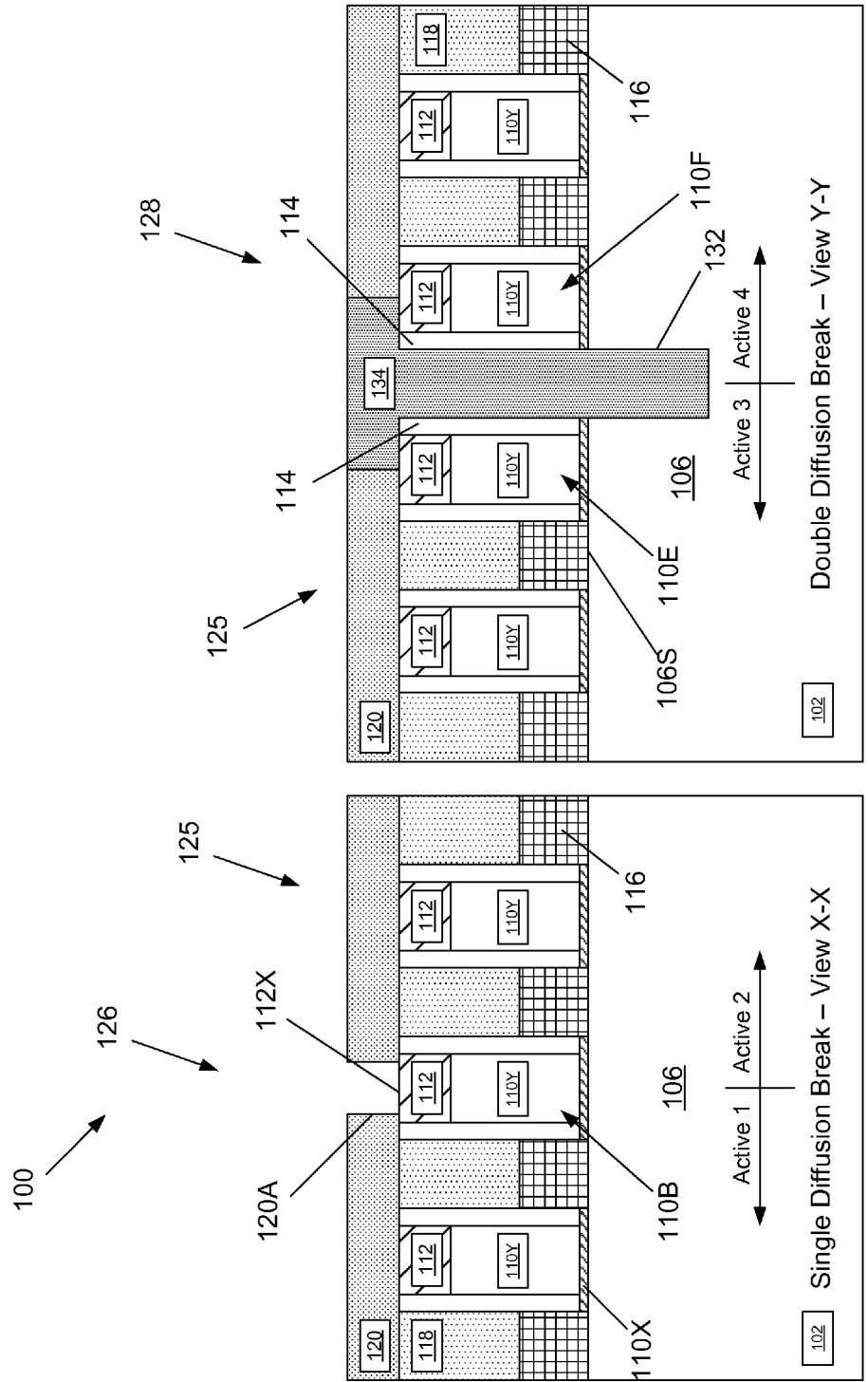
Figure 2L:
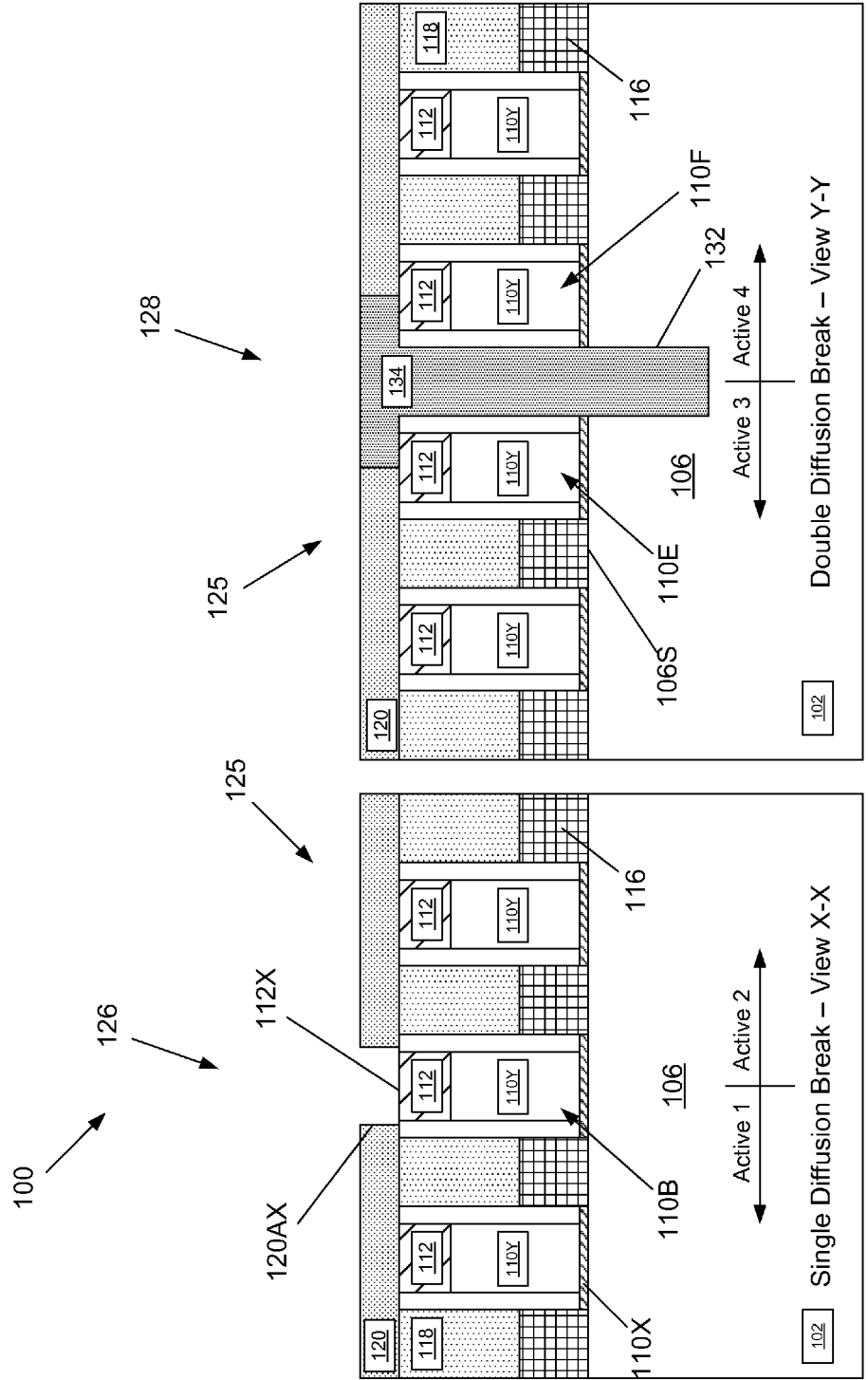
Figure 2M:
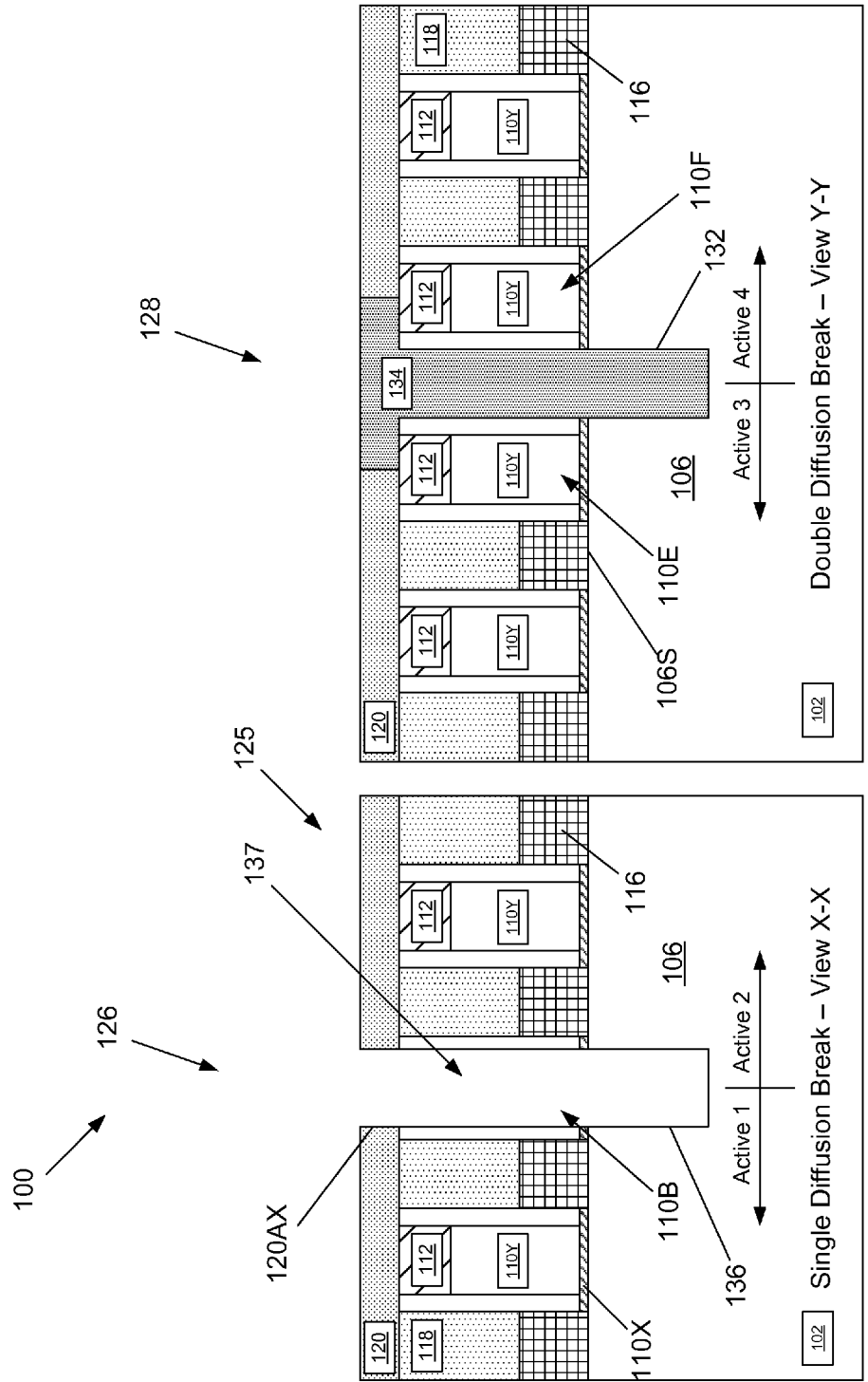
Figure 2N:
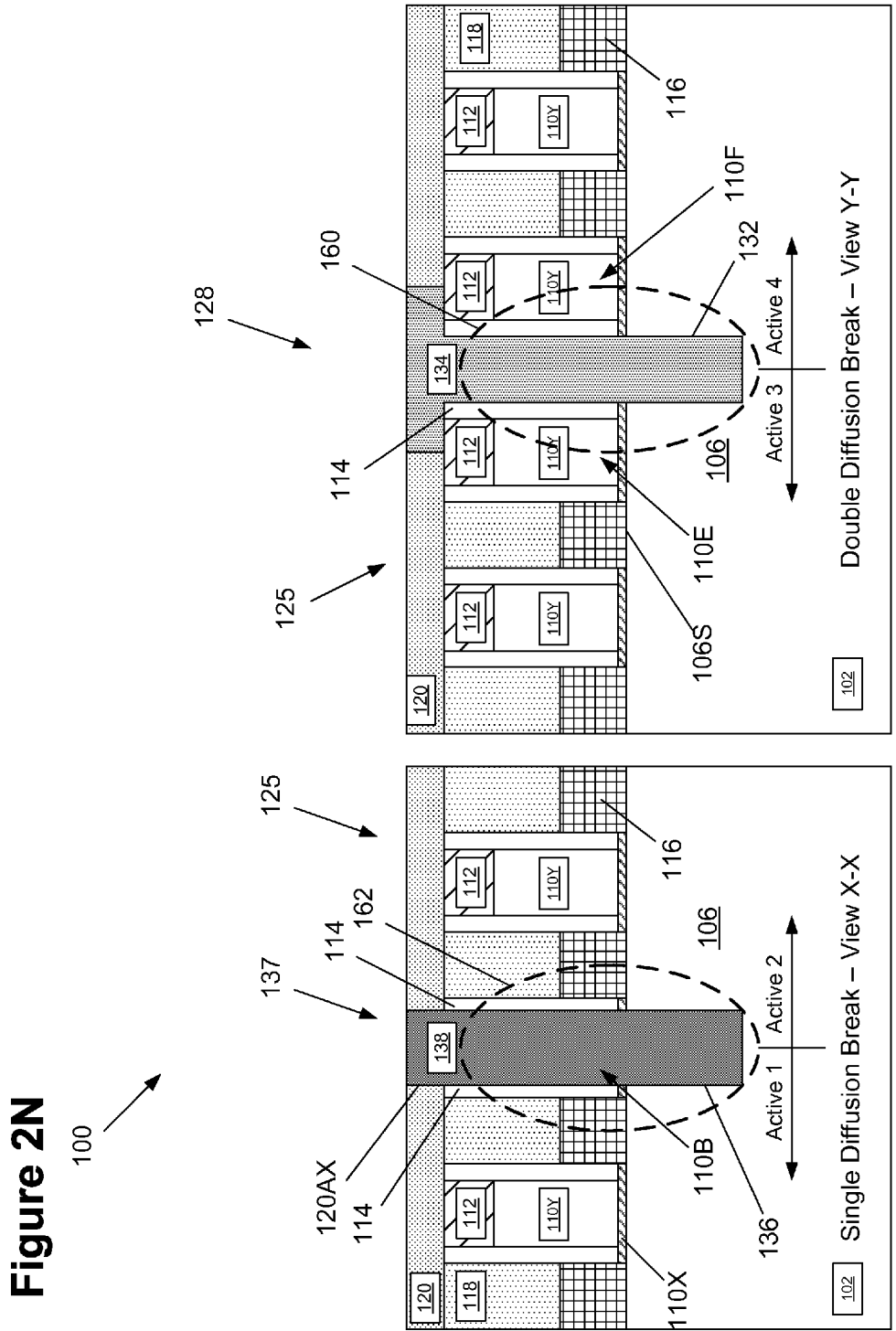
Figure 2O:
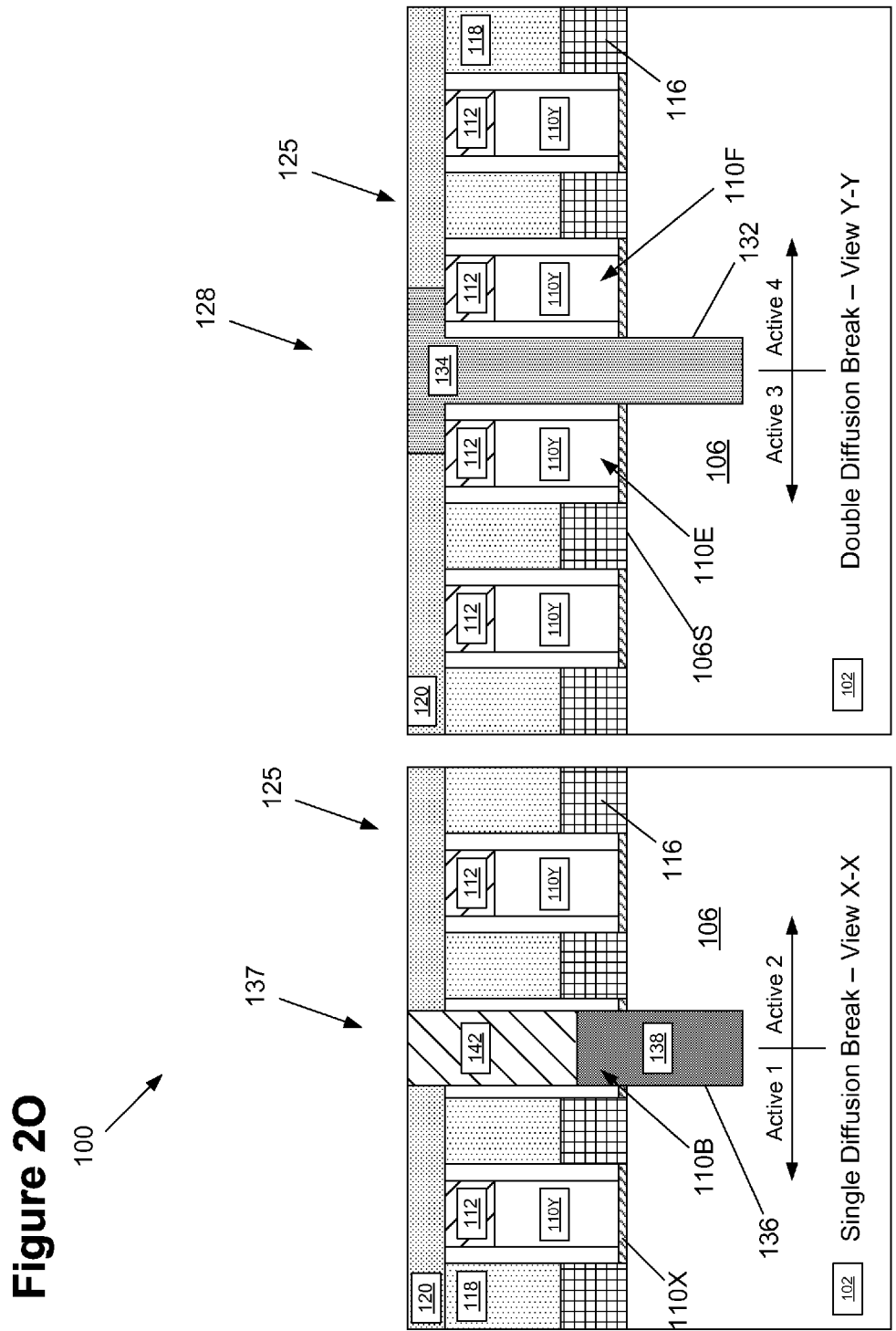
Figure 2P:
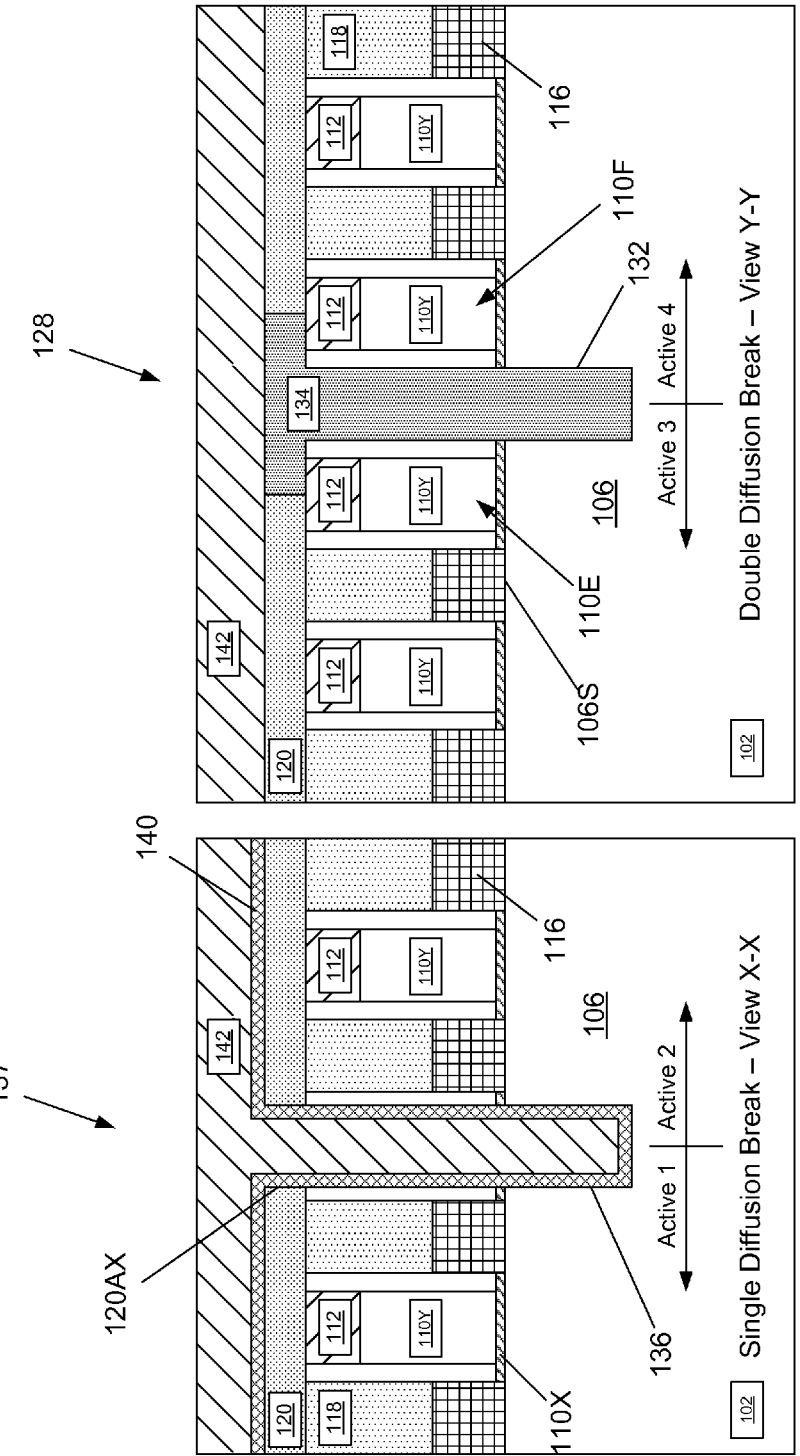
Figure 2Q:
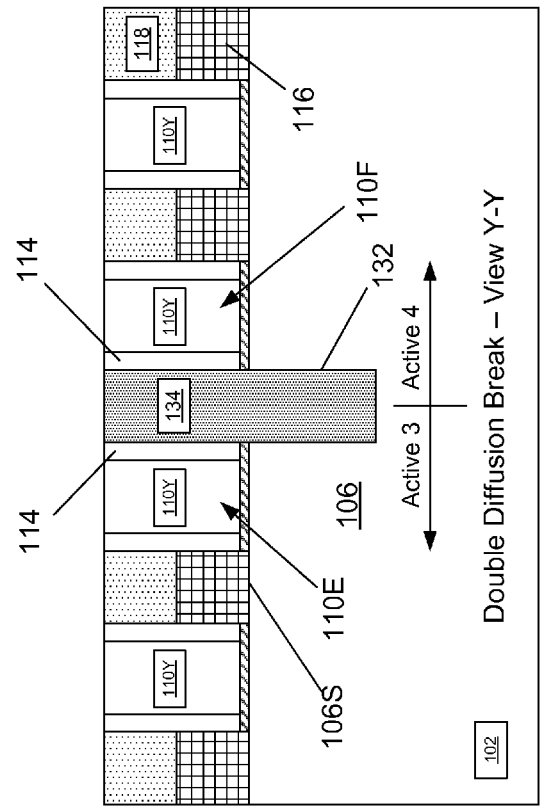
Figure 2Q:
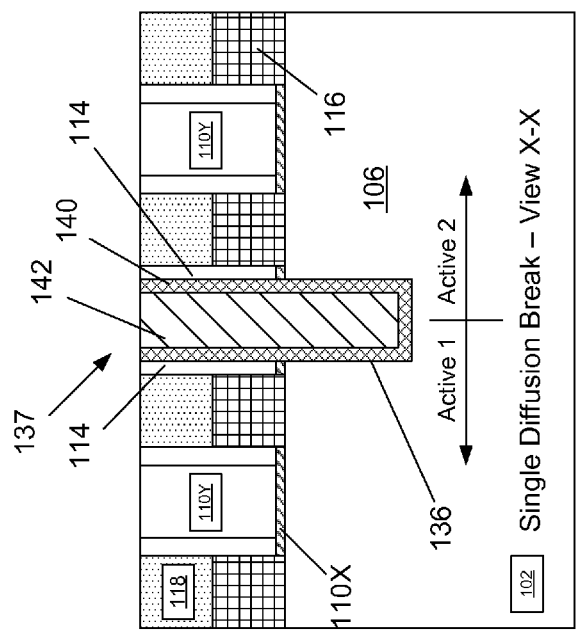
Figure 2R:
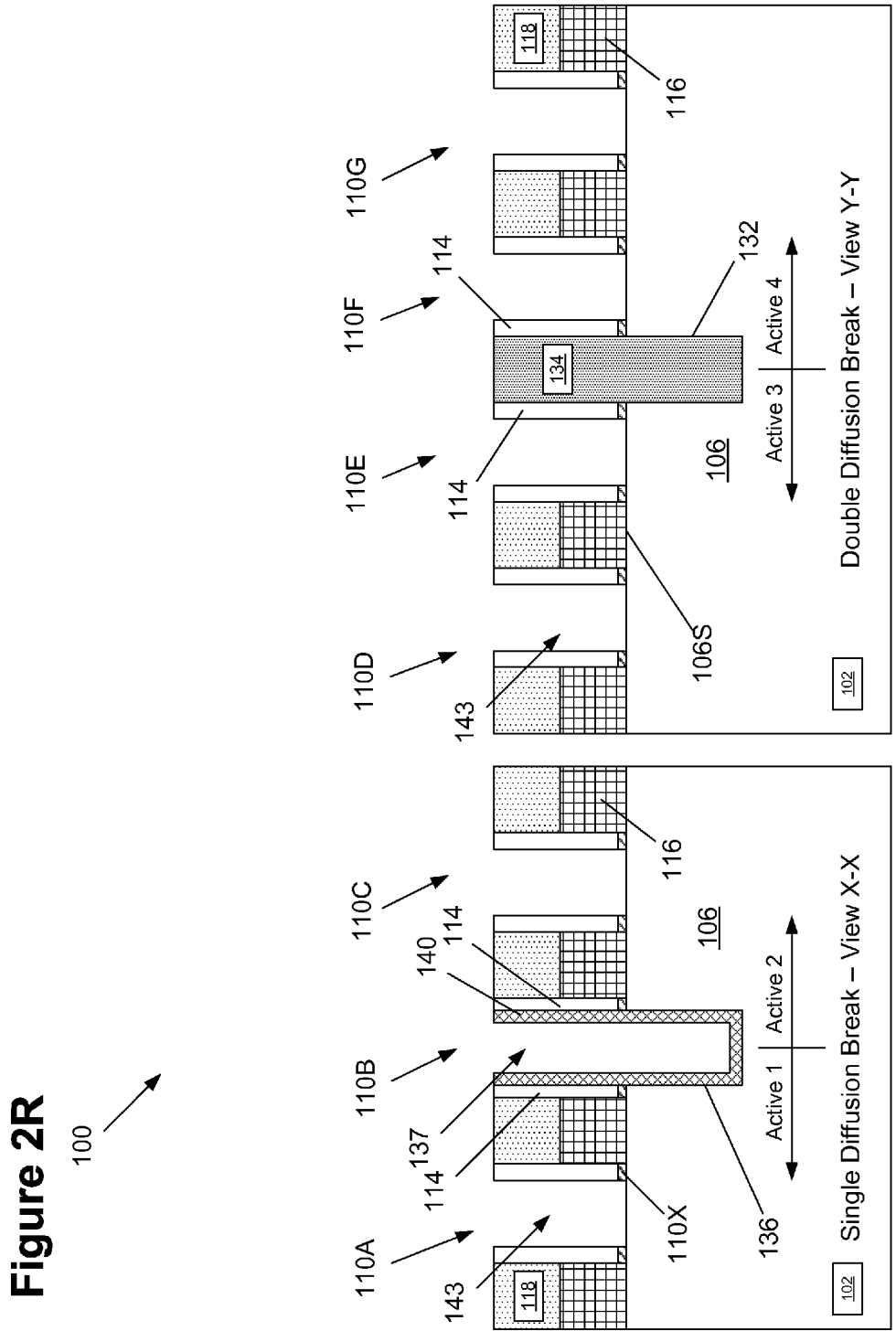
Figure 2T:
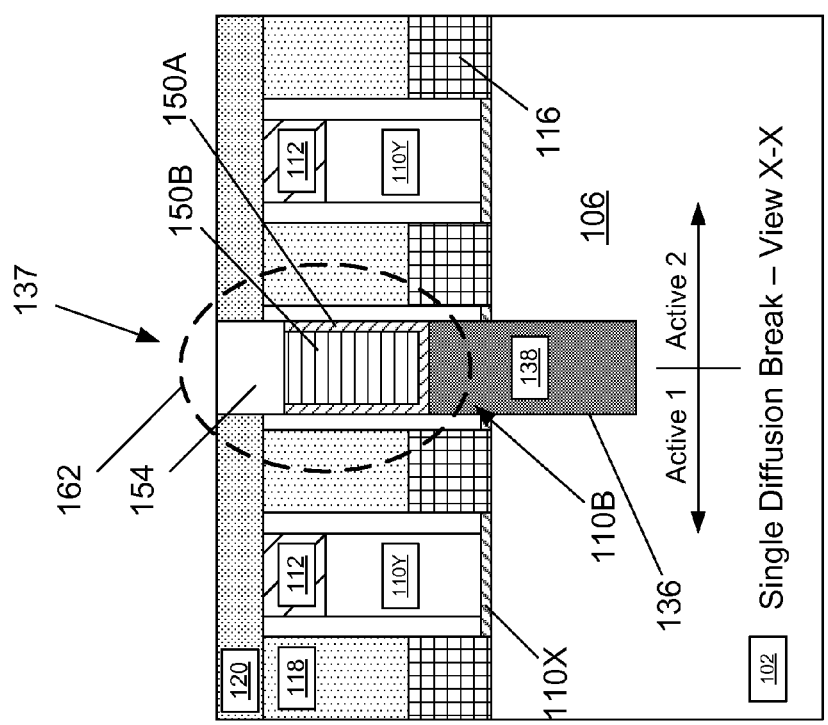

FIGS. 2A-2T present various views of one illustrative embodiment of a method of forming single and double diffusion breaks on an integrated circuit product 100 comprised of FinFET devices and the resulting products. In general, the drawings depict the formation of an integrated circuit product 100 that includes a single diffusion break (SDB) isolation structure (left side) and a double diffusion break (DDB) isolation structure (right side) formed in the same semiconductor substrate 102. As indicated in FIG. 2A, after formation, the SDB isolation structure will separate portions of the substrate 102 into active regions 1 and 2 (shown in dashed lines) where semiconductor devices, e.g., transistors, will be formed. Similarly, after formation, the DDB isolation structure will separate portions of the substrate 102 into active regions 3 and 4 (shown in dashed lines) where semiconductor devices, e.g., transistors, will be formed. FIG. 2A also includes simplistic plan views of the product 100 that depicts the location where various cross-sectional views depicted in the following drawings will be taken. The view "X-X" is a cross-sectional view for the portion of the product 100 where the SDB isolation structure will be formed. More specifically, the view "X-X" is a cross-sectional view that is taken through the long axis of a fin transverse to the long axis of the gate structures of a single dummy gate structure 110B (under which the SDB isolation structure will be formed) and two active gate structures 110A (for the device to be formed above the Active 1 region) and 110C (for the device to be formed above the Active 2 region). Stated another way, the view "X-X" is a cross-sectional view that is taken in a direction that corresponds to the current transport direction of the active devices. Similarly, the view "Y-Y" is a cross-sectional view for the portion of the product 100 where the DDB isolation structure will be formed. More specifically, the view "Y-Y" is a cross-sectional view that is taken through the long axis of a fin transverse to the long axis of the gate structures of two dummy gate structures 110E, 110F and two active gate structures: 110D (for the device to be formed above the Active 3 region) and 110G (for the device to be formed above the Active 4 region). The DDB isolation structure will be formed in the area between the two dummy gate structures 110E, 110F.

In the examples depicted herein, the integrated circuit product 100 will be formed in and above the semiconductor substrate 102. The substrate 102 may have a variety of configurations, such as a silicon-on-insulator (SOI) or silicon-germanium-on-insulator (SGOI) that includes a bulk semiconductor layer, a buried insulation layer and an active layer. Alternatively, the substrate may have a simple bulk configuration. The substrate 102 may be made of silicon or it may be made of materials other than silicon. Thus, the terms "substrate" or "semiconductor substrate" should be understood to cover all semiconducting materials and all forms of such materials.

In the process flow depicted herein, the integrated circuit product includes a plurality of FinFET devices wherein the gate structures for the FinFET devices are formed using replacement gate manufacturing techniques. Accordingly, FIG. 2A depicts the product 100 at a point in fabrication wherein several process operations have been performed. First, one or more etching processes were performed through a patterned etch mask (not shown) so as to define a plurality of fin-formation trenches (not shown) in the substrate 102. This results in the formation of a plurality of fins 106 having an upper surface 106S. The methods and devices disclosed herein may be employed when manufacturing FinFET devices having any number of fins 106. The overall size, shape and configuration of the fin-formation trenches and the fins 106 may vary depending on the particular application. In one illustrative embodiment, based on current day technology, the overall height of the fins 106 may range from approximately 20-50 nm. In the illustrative examples depicted in the attached figures, the fins 106 will be simplistically depicted as having generally rectangular portions and sections. In an actual real-world device, the sidewalls of the fins may be somewhat outwardly tapered (the fin is wider at the bottom of the fin than it is at the top of the fin), although that configuration is not depicted in the drawings. Thus, the size and configuration of the fins 106, and the manner in which they are made, should not be considered a limitation of the present invention. For ease of disclosure, only the substantially rectangular-shaped fins 106 will be depicted in the drawings.

The inventions disclosed herein will be disclosed in the context of forming a gate structure for the FinFET devices by performing a replacement gate process. Accordingly, FIG. 2A also depicts the product 100 after a plurality of sacrificial gate structures 110 (collectively referred to by the number 110), e.g., 110A-G, as well as associated gate cap layers 112 and sidewall spacers 114 were formed above and around the fins 106. The sacrificial gate structures 110A, 110C, 110D and 110G are active gate structures for FinFET devices that will be formed above active regions 1, 2, 3 and 4, respectively. The sacrificial gate structures 110B, 110E and 110F are dummy gates that are formed such that the fins 106 may be tucked under the dummy gate structures positioned at the edge of the active region. The simplistically depicted sacrificial gate structures 110 comprise a sacrificial gate insulation layer 110X and a layer of sacrificial gate electrode material 110Y. The sacrificial gate insulation layer 110X may be comprised of a material such as silicon dioxide, and the sacrificial gate electrode material 110Y may be comprised of a material such as polysilicon or amorphous silicon. The gate cap layers 112 and the sidewall spacers 114 may be comprised of a material such as silicon nitride. The thickness of these materials may vary depending upon the particular application.

FIG. 2A also depicts the product after optional epi semiconductor material 116 was grown on the portions of the fins 106 positioned in the source/drain regions of the FinFET devices, i.e., on the portions of the fins 106 positioned laterally outside of the spacers 114. In some applications, the fins 106 in the source/drain regions of the product 100 may be recessed prior to the formation of the epi semiconductor material 116. The thickness or height of the epi material 116 (when present) may vary depending upon the particular application.

FIG. 2B depicts the product 100 after a layer of insulating material 118, e.g., silicon dioxide, was deposited above the device 100 depicted in FIG. 2A, and after a planarization process (e.g., CMP) was performed on the layer of insulating material 118 using the gate cap layers 112 as a polish-stop.

FIG. 2C depicts the product 100 after illustrative layers of material 120 and 122 were formed above the substrate 102 by performing blanket deposition processes. The layer 120 may be a layer of silicon dioxide. The layer of insulating material 120 may be the same material as that of the layer of material 118. Different shading is provided for the layer of insulating material 120 simply to show it was formed at a later point in the illustrative process flow depicted herein than was the layer of insulating material 118. The layer of material 122 may be, for example, a layer of silicon nitride. In general, the layer 122 should be made of a material that may be selectively removed (by etching) relative to the materials of the layers 120, 118. In one illustrative embodiment, the layer 122 may have a thickness of about 20-30 nm.

FIG. 2D depicts the product 100 after a patterned "fin-cut" masking layer 124, e.g., a patterned layer of photoresist, was formed above the product depicted in FIG. 2C using traditional photolithography tools and techniques. An opening 124A in the patterned masking layer 124 exposes the area where the SDB isolation structure will be formed in the substrate 102, while an opening 124B in the patterned masking layer 124 exposes an area where the DDB isolation structure will be formed in the substrate 102. Importantly, using the methods disclosed herein, only a single "fin-cut" masking layer is formed as part of the process of forming the SDB and DDB isolation structures in the substrate 102 and the single fin-cut mask 124 is formed by performing known photolithographic techniques, e.g., exposing and developing a single layer of photoresist material. Using such a single masking layer 124 reduces manufacturing costs and processing complexities. Of course, as shown more fully below, the pattern in the patterned mask layer 124 will be essentially transferred to an underlying layer of material by performing at least one etching process through the patterned masking layer 124. As depicted, the lateral width 124X of the opening 124A for the SDB isolation structure is smaller than the lateral width 124Y of the opening 124B for the DDB isolation structure. In one illustrative example, the opening 124A may be smaller (e.g., 10-15 nm) than the gate critical dimension of the gate structures for the FinFET devices, while the opening 124B may be about 40-50 nm, or about the same as the gate pitch of the gate structures for the devices on the product 100.

FIG. 2E depicts the product 100 after several process operations were performed. First, a first common etching process was performed through the openings 124A, 124B in the patterned masking layer 124 to remove exposed portions of the material layer 122, wherein the material layer 120 serves as an etch stop layer. Then, with or without the masking layer 124 in position, a common, timed, recess etching process was performed to remove the exposed portions of the layer of material 120. The recess etching process is timed to stop just as the gate cap layers 112 are exposed. Thereafter, if not removed previously, the masking layer 124 may be removed. These process operations result in the formation of a patterned multi-layer masking layer 125 (comprising the layers 122 and 120) that have an opening 126 (corresponding to a first area where the SDB isolation structure will be formed) and an opening 128 (corresponding to a second area where the DDB isolation structure will be formed). Rather than the two step etch process disclosed above, in some applications, a single etching process may be performed through the patterned masking layer 124 so as to remove portions of both the material layers 122, 120, thereby resulting in the patterned multi-layer masking layer 125 depicted in FIG. 2E.

FIG. 2F depicts the product 100 after a layer of material 130 was formed above the product 100 depicted in FIG. 2E by performing a conformal deposition process, e.g., ALD, CVD. In one illustrative embodiment, the layer of material 130 may be comprised of the same material as that of the layer 122, e.g., silicon nitride. The thickness of the layer of material 130 may vary depending upon the particular application but it should be such that the layer of material 130 effectively fills the opening 126 in the patterned multi-layer masking layer 125, i.e., such that it pinches-off the opening 126, while only lining the larger opening 128 in the patterned multi-layer masking layer 125.

FIG. 2G depicts the product after a wet, isotropic etching process was performed to effectively remove the conformal layer of material 130, while leaving the smaller opening 126 in the patterned multi-layer masking layer 125 substantially filled with the layer of material 130. As depicted, this process operation effectively clears substantially the entire layer of material 130 from within the larger opening 128 in the patterned multi-layer masking layer 125.

FIG. 2H depicts the product 100 after an etching process was performed through the opening 128 in the patterned multi-layer masking layer 125 to remove the insulation material 118 between the dummy gate structures 110E and 110F. This process operation exposes the source/drain region (e.g., the epi material 116) between these two gate structures.

FIG. 2I depicts the product 100 after another etching process was performed through the opening 128 in the patterned multi-layer masking layer 125 to define a DDB trench 132 in the fin/substrate. In general, the DDB trench 132 will be substantially self-aligned to the sidewall spacers 114 adjacent the dummy gate structures 110E, 110F. The depth of the DDB trench 132 may vary depending upon the particular application (e.g., 30-200 nm below the bottom of the fins 106).

FIG. 2J depicts the product 100 after a layer of insulating material 134, e.g., silicon dioxide, was deposited above the device 100 depicted in FIG. 2I so as to overfill the opening 128 in the patterned multi-layer masking layer 125, and after one or more planarization processes (e.g., CMP) were performed to remove excess amounts of the insulating material 134 and portions of the material layer 122 positioned above the material layer 120. That is, the upper layer 122 of the patterned multi-layer masking layer 125 was removed. These process operations result in the formation of a double diffusion break (DDB) isolation structure 160 (in the dashed line region). Note that portions of the layer of material 130 still remain positioned in the opening 126 in the patterned multi-layer masking layer 125 after the completion of these process operations. The layer of insulating material 134 may be the same material as that of the layers of material 118 or 120. A different shading is provided for the layer of insulating material 134 simply to show it was formed at a later point in the illustrative process flow depicted herein than were the layers of insulating material 118, 120.

FIG. 2K depicts the product 100 after an etching process was performed to remove the portions of the layer of material 130 still positioned in the opening 126 in the remaining layer 120 of the patterned multi-layer masking layer 125 so as to expose an opening 120A in the layer of material 120 and to expose an upper surface 112X of the gate cap layer 112 of the dummy gate structure 110B.

FIG. 2L depicts the product 100 after a trimming etch process, e.g., an isotropic etch process, was performed on the layer of material 120 so as to effectively increase the lateral width of the opening 120A (FIG. 2K) to a wider opening 120AX shown in FIG. 2L. This process operation effectively exposes more of the gate cap layer 112 and perhaps a portion of the sidewall spacer 114 on the gate structure 110B. After completion of this etching process, the opening 120AX may have a lateral width of about 2-15 nm. This trimming process also reduces the thickness of the layer of material 120 by a small amount.

FIG. 2M depicts the product 100 after one or more etching processes were performed through the opening 120AX in the layer 120 of the patterned multi-layer masking layer 125 to define a SDB trench 136 in the fin/substrate. In general, the SDB trench 136 will be substantially self-aligned to the sidewall spacers 14 of the dummy gate structure 110B. The depth of the SDB trench 132 may vary depending upon the particular application (e.g., 30-200 below the bottom of the fins 106). During these one or more etching processes, at least portions of the gate cap layer 112, the sacrificial gate electrode 110Y, the sacrificial gate insulation layer 110X and the fin/substrate material will be removed so as to define an SDB opening 137.

At the point in the process flow shown in FIG. 2M, there are several options for how to fill the SDB opening 137 so as to form an SDB isolation structure 162. For example, FIG. 2N depicts the product 100 after a layer of insulating material 138, e.g., silicon dioxide, silicon nitride, etc., was deposited above the device 100 depicted in FIG. 2M so as to overfill the SDB opening 137, and after one or more planarization processes (e.g., CMP) were performed to remove excess amounts of the insulating material 138 positioned above the material layer 120. These process operations result in the formation of a single diffusion break (SDB) isolation structure 162 (in the dashed line region) comprised of only dielectric insulating materials. This configuration may be useful in some applications where there is no need or desire to form a conductive material in all or part of the space occupied by insulating material 138 shown in FIG. 2N. Such a configuration of the SDB isolation structure 162 (comprised of only insulating materials) may be useful in reducing parasitic capacitance.

As another example, FIG. 2O depicts the product 100 after the insulating material 138 was deposited and planarized as shown in FIG. 2N. Then, the layer of insulating material 138 was recessed and another layer of material 142, such as amorphous silicon, was deposited so as to overfill the unfilled portion of the SDB opening 137. Thereafter, a CMP process was performed to remove excess amounts of the layer of material 142 positioned above the material layer 120. As discussed more fully below, the material 142 may be removed as part of the replacement gate process and one or more conductive materials may be formed in the SDB opening 137 above the recessed layer of insulating material 138.

FIGS. 2P-2S depict yet another technique that may be used to fill the SDB opening 137 (shown in FIG. 2M) so as to define the SDB isolation structure 162. FIG. 2P depicts the product 100 after an insulating material layer 140 was formed above the product 100 depicted in FIG. 2M by performing a conformal deposition process, e.g., ALD, CVD. In one illustrative embodiment, the conformal insulating layer 140 may be comprised of a material such as silicon dioxide or silicon nitride. The thickness of the conformal layer 140 may vary depending upon the particular application, e.g., 3-8 nm. Next, the above-described layer of material 142 (e.g., amorphous silicon) was deposited so as to overfill the SDB opening 137.

FIG. 2Q depicts the product 100 after one or more CMP process operations were performed so as to effectively expose the upper surface of the sacrificial gate electrodes 110Y of the sacrificial gate structures 110. These process operations involve removal of the layer of material 120 of the patterned multi-layer masking layer 125, the gate cap layers 112 and removal of portions of the layers of material 142, 140, 134 and 118 as well as removal of portions of the vertical height of the sidewall spacers 114. These materials are removed as part of the replacement gate process. Thus, a similar process operation would be performed when the SDB opening 137 is filled using either of the techniques shown in FIGS. 2N-2O.

FIG. 2R depicts the product 100 after one or more etching processes were performed to remove the sacrificial gate electrode material 110Y and the sacrificial gate insulation layer 110A of all of the sacrificial gate structures 110. These process operations result in the formation of a plurality of replacement gate cavities 143 that exposes the surface 106S of the fins 106 within the cavities 143. These process operations also result in the removal of the material layer 142 from above the conformal insulating layer 140 in the SDB opening 137.

FIG. 2S depicts the product 100 after a replacement or final gate structure 150 and a gate cap layer 152 (e.g., silicon nitride) were formed in each of the replacement gate cavities 143. The replacement gate structures 150 depicted herein are intended to be representative in nature of any type of replacement gate structure that may be employed in manufacturing integrated circuit products. Typically, the replacement gate structure 150 is comprised of a gate insulation material 150A and various layers of conductive material (collectively referenced by the number 150B) that are sequentially deposited into the cavities 143 and above the layer of insulating material 118. For example, a conformal deposition process may be performed to form a high-k (k value of 10 or greater) gate insulation layer 150A in the replacement gate cavities 143 and one or more conductive metal layers 150B (which serve as the conductive gate structure of the completed devices) may then deposited into the gate cavities 143. Then, one or more CMP processes were performed to remove excess materials positioned outside of the gate cavities 143 and above the layer of insulating material 118. Next, a recess etching process was performed to recess the materials in the cavities 143 to make room for the gate cap layers 152. Then, the gate cap layers 152 were formed in the gate cavities 143 above the recessed gate materials. Note that the SDB opening 137 is exposed during the replacement gate manufacturing process. Thus, as shown in FIG. 2S, the SDB opening 137 is filled with the gate insulation material 150A and the materials that comprise the conductive gate structure 150B. These materials were also recessed within the SDB opening 137 and a cap layer 154 was formed at the same time as were the gate cap layers 152. This results in the formation of yet another embodiment of the SDB isolation structure 162. In this embodiment, the insulation materials 140 and 150A serve to provide the desired isolation function of the SDB isolation structure 162. Additionally, since there are conductive materials positioned within the SDB opening 137, i.e., the conductive materials 150, those conductive materials may serve other purposes, e.g., such as functioning as a local interconnect structure or line, while still not adversely affecting the isolating nature of the SDB isolation structure 162.

With respect to the example shown in FIG. 2O, yet another configuration of the SDB isolation structure 162 may be formed. As shown in FIG. 2T, starting with the structure shown in FIG. 2O, wherein the layer of material 142 (e.g., amorphous silicon) was formed above the recessed layer of insulating material 138, the layer of material 142 in FIG. 2O would be removed as part of the process of removing the sacrificial gate structures (described above). Thereafter, the conductive materials 150 and the cap layer 154 would be formed above the recessed layer of insulating material 138. As such, these conductive materials may serve other purposes, e.g., such as functioning as a local interconnect structure or line, while still not adversely affecting the isolating nature of the recessed insulating material 138.

One novel feature of the IC product 100 disclosed herein is that the DDB isolation structures 160 and the SDB isolation structures 162 depicted herein all engage and contact sidewall spacers 114 along a portion of their vertical height. For example, as shown in FIG. 2S, a first sidewall spacer 114 positioned adjacent (i.e., on opposite sides) of the gate 110B (a first gate structure) contacts and engages both of the opposite sides of the SDB isolation structure 162. Similarly, a second sidewall spacer 114 of the gate 110E (a second gate structure) contacts and engages a first sidewall of the DDB isolation structure 160, while a second sidewall spacer 114 of the gate 110F (a third gate structure) contacts and engages a second (opposite) sidewall of the DDB isolation structure 160. Of course, the actual gate structures for the gates 110B, 110E and 110F continue into and out of the drawing page of FIG. 2S where they cross other active regions (not shown). That is, the DDB isolation structures 160 and the SDB isolation structures 162 disclosed herein are self-aligned with respect to sidewall spacers 114 formed adjacent gate structures 110 on the product 100. This is true even though the DDB isolation structures 160 and the SDB isolation structures 162 may be made of the same materials (same material configuration, e.g., both may be comprised of only insulating materials) or they may be made of different materials (e.g., one comprising only insulating materials while the other comprises one or more conductive materials) and they also may be the same or different in terms of the physical size of the overall isolation structures 160, 162.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a double diffusion break (DDB) isolation structure and a single diffusion break (SDB) isolation structure in a semiconductor substrate, comprising:
    forming a plurality of sacrificial gate structures above a plurality of fins defined in said semiconductor substrate;
    forming a multi-layer patterned masking layer above said substrate, said multi-layer patterned masking layer comprising a first layer of material and a second layer of material positioned above said first layer of material and first and second openings that extend through both of said first and second layers of material, wherein said first opening is positioned above a first area of said substrate between a first and a second of said plurality of sacrificial gate structures where said DDB isolation structure will be formed and said second opening is positioned above a second area of said substrate under a third of said plurality of sacrificial gate structures where said SDB isolation structure will be formed;
    performing at least one first process operation through said first opening in both said first and second layers of material to form said DDB break isolation structure in said substrate in said first area;
    performing at least one second process operation to remove said second layer of material from above said first layer of material and to expose said first opening formed in said first layer of material; and
    performing at least one third process operation through said second opening in said first layer of material to form said SDB isolation structure in said substrate in said second area.

2. The method of claim 1, wherein forming said multi-layer patterned masking layer comprises:
    forming said first layer of material above said substrate;
    forming said second layer of material on and in contact with said first layer of material;
    forming a single patterned etch mask that comprises a photoresist material above said second layer of material, said single patterned etch mask having openings that correspond to both said first and second openings; and
    performing at least one etching process through said openings in said single patterned etch mask to define said first and second openings in said first and second material layers.

3. The method of claim 1, wherein performing said at least one first process operation comprises performing at least one first etching process through said first opening in both said first and second layers of material to define a double diffusion break trench in said substrate in an area between said first and second sacrificial gate structures and filling said double diffusion break trench with an insulating material.

4. The method of claim 1, wherein performing said at least one second process operation comprises performing a chemical mechanical polishing process to remove said second layer of material from above an upper surface of said first layer of material and thereafter performing an etching process to remove any material positioned within said second opening in said first layer of material.

5. The method of claim 1, wherein, after forming said multi-layer patterned masking layer, the method further comprises:
    performing a conformal deposition process to form a conformal layer of material in said first and second openings, wherein said conformal layer of material substantially fills said second opening; and
    performing an isotropic etching process to remove said conformal layer of material from within said first opening while leaving material of said conformal layer of material positioned within said second opening.

6. The method of claim 1, wherein, prior to performing said at least one third process operation, the method comprises performing a trim etching process to increase a lateral width of said second opening in said first layer of material.

7. The method of claim 1, wherein said first opening has a lateral width that is larger than a lateral width of said second opening.

8. The method of claim 1, wherein performing said at least one third process operation comprises:
    removing said third sacrificial gate structure so as to define an exposed gate cavity positioned between a sidewall spacer;
    performing at least one second etching process through said exposed gate cavity so as to define a single diffusion break trench in said substrate; and
    performing at least one process operation through said exposed gate cavity to form said single diffusion break isolation structure in said single diffusion break trench.

9. The method of claim 8, wherein performing said at least one process operation through said exposed gate cavity to form said single diffusion break isolation structure in said single diffusion break trench comprises filling said exposed gate cavity and said single diffusion break isolation trench with an insulation material.

10. The method of claim 9, wherein performing said at least one process operation through said exposed gate cavity to form said single diffusion break isolation structure in said single diffusion break trench further comprises:
    performing a recess etching process on said insulating material so as to define a recessed insulating material that has a recessed upper surface positioned within said single diffusion break isolation trench; and forming an amorphous silicon material within said single diffusion break isolation trench and above said recessed upper surface of said recessed insulating material.

11. The method of claim 8, wherein performing said at least one process operation through said exposed gate cavity to form said single diffusion break isolation structure in said single diffusion break trench comprises:
performing a conformal deposition process to form a layer of insulating material that lines said single diffusion break isolation trench and said exposed gate cavity; and
forming an amorphous silicon material within said single diffusion break isolation trench on said layer of insulating material that lines said single diffusion break isolation trench and said exposed gate cavity.

12. The method of claim 11, further comprising:
performing at least one etching process to remove all remaining sacrificial gate structures and said layer of amorphous silicon material within said single diffusion break isolation trench, wherein said removal of said sacrificial gate structures defines a plurality of replacement gate cavities;
performing a common deposition process to form a layer of high-k insulation material within said replacement gate cavities and on said layer of insulating material that lines said single diffusion break isolation trench and said exposed gate cavity; and
performing a common deposition process to form at least one metal layer on said high-k insulation material within said replacement gate cavities and on said layer of insulating material that lines said single diffusion break isolation trench and said exposed gate cavity.

13. A method of forming a double diffusion break (DDB) isolation structure and a single diffusion break (SDB) isolation structure in a semiconductor substrate, comprising:
forming a plurality of sacrificial gate structures above a plurality of fins defined in said semiconductor substrate;
forming a multi-layer patterned masking layer above said substrate, said multi-layer patterned masking layer comprising a first layer of material and a second layer of material positioned above said first layer of material and first and second openings that extend through said first and second layers of material, wherein said first opening is positioned above a first area of said substrate between a first and a second of said plurality of sacrificial gate structures where said DDB isolation structure will be formed and said second opening is positioned above a second area of said substrate under a third of said plurality of sacrificial gate structures where said SDB isolation structure will be formed;
performing a conformal deposition process to form a conformal layer of material in said first and second openings, wherein said conformal layer of material substantially fills said second opening;
performing an isotropic etching process to remove said conformal layer of material from within said first opening while leaving material of said conformal layer positioned within said second opening so as to block said second opening;
with said second opening blocked, performing at least one first etching process through said first opening in both said first and second layers of material to define a double diffusion break trench in said substrate;
performing at least one first process operation to form said DDB isolation structure in said double diffusion break trench;
performing at least one second process operation to remove said second layer of material from above an upper surface of said first layer of material and to remove said material of said conformal layer positioned within said second opening in said first layer of material;
performing at least one second etching process through said second opening in said first layer of material to define a single diffusion break trench in said substrate; and
performing at least one third process operation to form said SDB isolation structure in said single diffusion break trench.

14. The method of claim 13, wherein forming said multi-layer patterned masking layer comprises:
forming said first layer of material above said substrate;
forming said second layer of material on and in contact with said first layer of material;
forming a single patterned etch mask that comprises a photoresist material above said second layer of material, said single patterned etch mask having openings that correspond to both said first and second openings; and
performing at least one etching process through said openings in said single patterned etch mask to define said first and second openings in said first and second material layers.

15. The method of claim 13, wherein performing said at least one first process operation to form said DDB isolation structure comprises filling said double diffusion break trench with an insulating material.

16. The method of claim 13, wherein performing said at least one second process operation comprises performing a chemical mechanical polishing process to remove said second layer of material from above said upper surface of said first layer of material and thereafter performing an etching process to remove said material of said conformal layer positioned within said second opening in said first layer of material.

17. The method of claim 13, wherein, prior to performing said at least one second etching process operation, the method comprises performing a trim etching process to increase a lateral width of said second opening in said first layer of material.

18. The method of claim 13, wherein performing said at least one third process operation comprises:
removing said third sacrificial gate structure so as to define an exposed gate cavity positioned between a sidewall spacer;
performing at least one second etching process through said exposed gate cavity so as to define said single diffusion break trench in said substrate; and
performing at least one process operation through said exposed gate cavity to form said single diffusion break isolation structure in said single diffusion break trench.

19. The method of claim 18, wherein performing said at least one process operation through said exposed gate cavity to form said SDB isolation structure in said single diffusion break trench comprises filling said exposed gate cavity and said single diffusion break isolation trench with an insulation material.

20. The method of claim 19, wherein performing said at least one process operation through said exposed gate cavity to form said SDB isolation structure in said single diffusion break trench further comprises:
performing a recess etching process on said insulating material so as to define a recessed insulating material that has a recessed upper surface positioned within said single diffusion break isolation trench; and forming an amorphous silicon material within said single diffusion break isolation trench and above said recessed upper surface of said recessed insulating material.

21. The method of claim 18, wherein performing said at least one process operation through said exposed gate cavity to form said SDB isolation structure in said single diffusion break trench comprises:

performing a conformal deposition process to form a layer of insulating material that lines said single diffusion break isolation trench and said exposed gate cavity; and forming an amorphous silicon material within said single diffusion break isolation trench on said layer of insulating material that lines said single diffusion break isolation trench and said exposed gate cavity.

22. The method of claim 21, further comprising:

performing at least one etching process to remove all remaining sacrificial gate structures and said layer of amorphous silicon material within said single diffusion break isolation trench, wherein said removal of said sacrificial gate structures defines a plurality of replacement gate cavities;

performing a common deposition process to form a layer of high-k insulation material within said replacement gate cavities and on said layer of insulating material that lines said single diffusion break isolation trench and said exposed gate cavity; and performing a common deposition process to form at least one metal layer on said high-k insulation material within said replacement gate cavities and on said layer of insulating material that lines said single diffusion break isolation trench and said exposed gate cavity.

* * * * *